United States Patent
Park et al.

(10) Patent No.: US 12,071,577 B2
(45) Date of Patent: Aug. 27, 2024

(54) QUANTUM DOT COMPOSITE AND ELECTRONIC DEVICE INCLUDING THE SAME

(71) Applicant: SAMSUNG ELECTRONICS CO., LTD., Suwon-si (KR)

(72) Inventors: Shang Hyeun Park, Yongin-si (KR); Tae Gon Kim, Hwaseong-si (KR); Shin Ae Jun, Seongnam-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 539 days.

(21) Appl. No.: 17/331,861

(22) Filed: May 27, 2021

(65) Prior Publication Data
US 2021/0371745 A1 Dec. 2, 2021

(30) Foreign Application Priority Data

May 27, 2020 (KR) .......................... 10-2020-0063926

(51) Int. Cl.
| | |
|---|---|
| C09K 11/88 | (2006.01) |
| B82Y 20/00 | (2011.01) |
| B82Y 40/00 | (2011.01) |
| C09K 11/02 | (2006.01) |
| C09K 11/08 | (2006.01) |
| H10K 59/38 | (2023.01) |

(52) U.S. Cl.
CPC ............ *C09K 11/883* (2013.01); *C09K 11/02* (2013.01); *C09K 11/0883* (2013.01); *H10K 59/38* (2023.02); *B82Y 20/00* (2013.01); *B82Y 40/00* (2013.01)

(58) Field of Classification Search
CPC .... C09K 11/0883; C09K 11/882; C09K 11/02
See application file for complete search history.

(56) References Cited

U.S. PATENT DOCUMENTS

| | | | |
|---|---|---|---|
| 6,322,901 | B1 | 11/2001 | Bawendi et al. |
| 8,174,034 | B2 | 5/2012 | Bogner et al. |
| 9,853,184 | B2 | 12/2017 | Coe-Sullivan et al. |
| 9,874,674 | B2 | 1/2018 | Coe-Sullivan et al. |
| 9,884,993 | B2 | 2/2018 | Guo et al. |
| 10,513,656 | B2 | 12/2019 | Nick et al. |
| 10,619,096 | B2 | 4/2020 | Park et al. |
| 10,707,371 | B2 | 7/2020 | Guo et al. |
| 10,770,619 | B2 | 9/2020 | Coe-Sullivan et al. |
| 11,193,062 | B2 | 12/2021 | Park et al. |
| 2008/0044340 | A1 | 2/2008 | Wu et al. |
| 2017/0250322 | A1 | 8/2017 | Wang et al. |
| 2020/0071607 | A1 | 3/2020 | Nick et al. |
| 2020/0172806 | A1 | 6/2020 | Park et al. |
| 2021/0384385 | A1* | 12/2021 | Nojima .................. H01L 33/502 |

FOREIGN PATENT DOCUMENTS

| | | | |
|---|---|---|---|
| CN | 107098324 A | | 8/2017 |
| JP | 2020-075971 | * | 5/2020 |
| KR | 20140017178 B1 | | 7/2014 |
| KR | 20170056610 A | | 5/2017 |
| KR | 20180060923 A | | 6/2018 |
| WO | WO 2020/095629 | * | 5/2020 |

OTHER PUBLICATIONS

Christian Blauth, et al., Transient overshoot and storage of charge carriers on ligands in quantum dot LEDs, J. Appl. Phys., vol. 126, No. 7, (2019), 075501, 9 pp.

Eunseog Cho, et al., Modeling on the size dependent properties of InP quantum dots: a hybrid functional study, Nanotechnology 24 (2013) 215201 (5pp).

Fan Cao, et al., A Layer-by-Layer Growth Strategy for Large-Size InP/ZnSe/ZnS Core-Shell Quantum Dots Enabling High-Efficiency Light-Emitting Diodes, Chem. Mater., vol. 30, No. 21, pp. 8002-8007.

Yang Li, et al., Stoichiometry-Controlled InP-Based Quantum Dots: Synthesis, Photoluminescence, and Electroluminescence, J. Am. Chem. Soc. 2019, 141, 6448-6452.

Christian Ippen, et al., "InP/ZnSe/ZnS: A Novel Multishell System for InP Quantum Dots for Improved Luminescence Efficiency and It's Application in a Light-Emitting Device", Journal of Information Display, vol. 13, No. 2, Jun. 2012, pp. 91-95.

Doe Hyeong Kim, et al., "Flexible Memristive Devices Based on InP/ZnSe/ZnS Core-Multishell Quantum Dot Nanocomposites", Applied Materials & Interfaces, vol. 10, No. 17, Apr. 10, 2018, pp. 14843-14849.

Eun-Pyo Jang, et al., "Near-Complete Photoluminescence Retention and Improved Stability of InP Quantum Dots After Silica Embedding for their Application to On-Chip-Packaged Light-Emitting Diodes", RSC Advances, vol. 8, No. 18, Jan. 1, 2018, pp. 10057-10063.

(Continued)

*Primary Examiner* — C Melissa Koslow

(74) *Attorney, Agent, or Firm* — CANTOR COLBURN LLP

(57) ABSTRACT

A quantum dot composite comprising: a matrix and a plurality of quantum dots dispersed in the matrix, wherein the plurality of the quantum dots comprises a semiconductor nanocrystal core including indium and phosphorous, a semiconductor nanocrystal shell disposed on the semiconductor nanocrystal core, and the semiconductor nanocrystal shell including zinc, selenium, and sulfur. The arithmetic size of the plurality of the quantum dots is greater than or equal to about 8 nm, wherein the quantum dot composite is configured to emit red light, and wherein when the quantum dot composite is irradiated with light of a wavelength of from about 450 nm to about 470 nm for a time period of less than or equal to about 500 hours, a luminance increase of the quantum dot composite is less than or equal to about 1.2% of an initial luminance of the quantum dot composite.

23 Claims, 7 Drawing Sheets

(56) References Cited

OTHER PUBLICATIONS

Extended European Search Report dated Jul. 30, 2021, of the corresponding European Patent Application No. 21176173.9, 10 pp.

Jan Ziegler, et al. "Silica-Coated InP/ZnS Nanocrystals as Converter Material in White LED's", Advanced Materials, VCH Publishers, vol. 20, No. 21, Nov. 3, 2008, pp. 4068-4073.

Jie Zhang, et al. "InP/ZnSe/ZnS Quantum Dots with strong dual emissions: visible excitonic emission and near-infrared surface defect emission and their application in in vitro and in vivo bioimaging" Journal of Materials Chemistry. B, vol. 5, No. 41, Jan. 1, 2017, pp. 8152-8160.

\* cited by examiner

Repeating the Patterning Process three times

QUANTUM DOT COMPOSITE AND ELECTRONIC DEVICE INCLUDING THE SAME

CROSS-REFERENCE TO RELATED APPLICATION

This application claims priority to Korean Patent Application No. 10-2020-0063926, filed in the Korean Intellectual Property Office on May 27, 2020, and all the benefits accruing therefrom under 35 U.S.C. § 119, the content of which in its entirety is herein incorporated by reference.

BACKGROUND

1. Field

A quantum dot composite or composition, and an electronic device including the quantum dot composite or composition are disclosed.

2. Description of the Related Art

Unlike a bulk material, quantum dots (e.g., nano-sized semiconductor nanocrystals) may have different energy bandgaps by controlling the sizes and compositions of the quantum dots. Quantum dots may exhibit electroluminescent and photoluminescent properties. In a colloidal synthesis, organic materials such as a dispersing agent may coordinate, e.g., be bound to a surface of the semiconductor nanocrystal during crystal growth, and a quantum dot having a controlled size and having luminescent properties may be provided. From an environmental standpoint, developing a cadmium free quantum dot with improved luminescent properties is desirable.

SUMMARY

An embodiment provides a quantum dot composite or composition that may exhibit improved luminescence properties and enhanced stability (e.g., process or optical stability).

An embodiment provides an electronic device including the quantum dot composite or the quantum dot composition.

In an embodiment, a quantum dot composite includes a matrix and a plurality of quantum dots dispersed in the matrix, wherein the plurality of quantum dots include a semiconductor nanocrystal core including indium (In) and phosphorous (P), a semiconductor nanocrystal shell disposed on the semiconductor nanocrystal core, the semiconductor nanocrystal shell including zinc, selenium, and sulfur, wherein the plurality of quantum dots have an arithmetic size of greater than or equal to about 8 nm (or greater than or equal to about 8.3 nm), and wherein when the quantum dot composite is irradiated with light of a wavelength of from about 450 nanometers (nm) to about 470 nm (for example, in a solid state) for a time period of less than or equal to about 500 hours, a luminescence increase of the quantum dot composite is less than or equal to about 1.2 percent of an initial luminescence thereof.

The quantum dot composite may be configured to emit red light.

The plurality of the quantum dots or the quantum dot composite may not include cadmium.

The quantum dot composite may exhibit a luminance decrease interval when it is irradiated with light of a wavelength of from about 450 nm to about 470 nm (for example, in a solid state) for about 100 hours.

A maximum peak wavelength of the red light may be greater than or equal to about 600 nm.

A maximum peak wavelength of the red light may be less than or equal to about 650 nm.

The arithmetic size of the plurality of quantum dots may be greater than or equal to about 8.5 nm.

The arithmetic size of the plurality of quantum dots may be greater than or equal to about 8.7 nm.

The arithmetic size of the plurality of quantum dots may be greater than or equal to about 9 nm.

The plurality of quantum dots may include first quantum dots (i.e., a first quantum dot population), the first quantum dots have a first arithmetic size that is greater than the arithmetic size of the plurality of quantum dots, and a fraction of the first quantum dots in the plurality of quantum dots may be greater than or equal to about 60 percent (%).

The first arithmetic size (e.g., of the first quantum dot population) may be greater than the arithmetic size of the plurality of quantum dots by at least about 1% or by at least about 5%.

The fraction of the first quantum dots in the plurality of quantum dots may be greater than or equal to about 70%.

The plurality of quantum dots may include second quantum dots (i.e., a second quantum dot population), the second quantum dots have a second arithmetic size that is less than or equal to 7.2 nm, and a fraction of the second quantum dots in the plurality of quantum dots may be less than or equal to about 18%.

A fraction of the second quantum dots in the plurality of quantum dots may be less than or equal to about 15%.

In an embodiment, the sum fraction of the first and the second quantum dot populations is greater than 85 percent of the plurality of quantum dots.

In an embodiment, the plurality of quantum dots may include a first quantum dot population with a first arithmetic size and a second quantum dot population with a second arithmetic size, and the first arithmetic size being greater than the arithmetic size of the plurality of quantum dots and the second arithmetic size being less than or equal to about 7.2 nm, and in the plurality of quantum dots, a fraction of the first quantum dot population may be greater than 60%, greater than or equal to about 75%, or greater than or equal to about 80% and a fraction of the second quantum dot population may be less than or equal to about 15%, or less than or equal to about 10%.

A size of the semiconductor nanocrystal core may be greater than or equal to about 3 nm. A size of the semiconductor nanocrystal core may be greater than or equal to about 3.5 nm. A size of the semiconductor nanocrystal core may be in a range of from about 3.6 nm to about 3.9 nm.

The semiconductor nanocrystal shell may include a first layer including a first semiconductor nanocrystal including zinc and selenium, and a second layer being disposed on the first layer, the second layer including a second semiconductor nanocrystal including zinc, sulfur, and optionally selenium, wherein a composition of the first semiconductor nanocrystal may be different from a composition of the second semiconductor nanocrystal.

The first layer or the first semiconductor nanocrystal may include a zinc selenide, a zinc selenide sulfide, or a combination thereof.

The second layer or the second semiconductor nanocrystal may include a zinc sulfide (e.g., may consist of ZnS).

The first layer may be adjacent to (e.g., be disposed directly on) the semiconductor nanocrystal core.

The second layer may be an outermost layer of the semiconductor nanocrystal shell (or the quantum dot).

The first layer may have a thickness of greater than or equal to about 1.5 nm, greater than or equal to about 1.7 nm, or greater than or equal to about 2 nm.

The second layer may have a thickness of less than or equal to about 0.7 nm.

The second layer may have a thickness of less than or equal to about 0.5 nm.

In the second quantum dots or the second quantum dot population, the first layer may have a thickness of less than or equal to about 1.7 nm or at most 5 monolayers.

The plurality of quantum dots may have a mole ratio of zinc with respect to indium (Zn:In) that is greater than or equal to about 13:1, and a mole ratio of sulfur with respect to selenium (S:Se) that is less than or equal to about 0.6:1. The plurality of quantum dots may have a mole ratio of zinc with respect to indium (Zn:In) that is greater than or equal to about 14:1, and a mole ratio of sulfur with respect to selenium (S:Se) that is less than or equal to about 0.5:1.

In the plurality of quantum dots (or the first quantum dot population or the second quantum dot population), a mole ratio of phosphorus with respect to indium (P:In) may be greater than or equal to about 0.6:1. In the plurality of quantum dots, a mole ratio of phosphorus with respect to indium may be less than or equal to about 0.9.

In the plurality of quantum dots (or the first quantum dot population or the second quantum dot population), a mole ratio of zinc with respect to a sum of sulfur and selenium (Zn:(S+Se)) may be less than or equal to about 1.1:1.

The matrix may include a polymerizable monomer including a carbon-carbon double bond, a thiol compound having at least one thiol group (for example, a terminal end thereof), a polymer, a liquid vehicle (e.g., an organic solvent), or a combination thereof.

The matrix may include a polymer matrix. The polymer matrix may include a polymerization product of a monomer combination including a thiol compound having a, e.g., at least one, thiol group (for example, at a terminal end thereof) and an ene compound having a carbon-carbon unsaturated bond (e.g., a polymerizable monomer).

The polymerizable monomer may include a (meth)acrylate compound having at least one (e.g., at least two, at least three, or at least four) (meth)acrylate group(s).

The polymer may include a linear polymer, a cross-linked polymer, or a combination thereof.

The crosslinked polymer may include a thiolene polymer, a crosslinked poly(meth)acrylate, a crosslinked polyurethane, a crosslinked epoxy resin, a crosslinked vinyl polymer, a crosslinked silicone resin, or a combination thereof.

The linear polymer may include a repeating unit derived from a monomer including a carbon-carbon double bond and optionally a carboxylic acid group.

The matrix may include a carboxylic acid group containing compound.

The carboxylic acid group containing compound may include a monomer combination including a first monomer including a carboxylic acid group and a carbon-carbon double bond, a second monomer including a carbon-carbon double bond and a hydrophobic moiety and not including a carboxylic acid group, and optionally a third monomer including a carbon-carbon double bond and a hydrophilic moiety and not including a carboxylic acid group;

a copolymer of the monomer combination;

a multiple aromatic ring-containing polymer having a backbone structure in which two aromatic rings are bound to a quaternary carbon atom that is a constituent atom of another cyclic moiety in the main chain and including a carboxylic acid group (—COOH); or a combination thereof.

The carboxylic acid group-containing compound may have an acid value of greater than or equal to about 50 milligrams of potassium hydroxide per gram (mg KOH/g). The carboxylic acid group-containing compound may have a molecular weight of greater than or equal to about 400 g/mol.

The thiol compound may include a dithiol compound, a trithiol compound, a tetrathiol compound, or a combination thereof.

The liquid vehicle may include an organic solvent.

The organic solvent may include an alkylene glycol compound, an alkylene glycol ether compound, an alkylene glycolether ester (e.g., acetate) compound, an amide solvent, a ketone solvent, a substituted or unsubstituted aliphatic hydrocarbon compound, a substituted or unsubstituted aromatic hydrocarbon compound, or a combination thereof.

The quantum dot composite may further include a metal oxide fine particle dispersed in the matrix. The metal oxide fine particle may be non-emissive.

The quantum dot composite may be in a form of a patterned film.

The quantum dot composite may have an absorption ratio of greater than or equal to about 90% with respect to blue light of a wavelength from about 450 nm to about 470 nm.

In an embodiment, a color filter includes the quantum dot composite (e.g., a pattern of the quantum dot composite).

In an embodiment, a display device includes a light emitting element and optionally a light source, wherein the light emitting element includes the aforementioned quantum dot composite and the light source is configured to provide the light emitting element with incident light.

The incident light may have a luminescence peak wavelength of about 440 nanometers to about 460 nanometers.

In an embodiment, a color filter includes the quantum dot polymer composite.

In an embodiment, the light emitting element may include a stacked structure including a substrate and a light emitting layer disposed on the substrate. The light emitting layer may include a pattern including the quantum dot composite.

The pattern may include at least one repeating section configured to emit light at a predetermined wavelength.

The pattern may include a first section configured to emit a first light.

The pattern may further include a second section configured to emit a second light having a center wavelength that is different from a center wavelength of the first light.

In an embodiment, a composition comprises a plurality of quantum dots, wherein the plurality of quantum dots include a first semiconductor nanocrystal including indium and phosphorus (e.g., an indium phosphide and/or an alloy thereof) and a second semiconductor nanocrystal including a zinc chalcogenide, wherein the zinc chalcogenide may include zinc; and selenium, sulfur, or a combination thereof, wherein an arithmetic size of the plurality of the quantum dots is greater than or equal to about 8 nm, and the plurality of quantum dots include second quantum dots (i.e., a second quantum dot population) with a second arithmetic size, wherein the second arithmetic size is less than or equal to about 7.2 nm, and a fraction of the second quantum dots in the plurality of quantum dots is less than or equal to about 18%.

The composition may include a polymerizable monomer including a carbon-carbon double bond, a thiol compound having at least one thiol group, a polymer, a liquid vehicle (e.g., an organic solvent), or a combination thereof.

In the plurality of quantum dots, a fraction of the second quantum dots may be less than or equal to about 15%.

The plurality of quantum dots may include first quantum dots (e.g., a first quantum dot population) with a first arithmetic size of greater than or equal to about 8 nm, and a fraction of the first quantum dots in the plurality of the quantum dots may be greater than 60% or greater than or equal to about 75%.

The first arithmetic size of the first population of quantum dots may be greater than or equal to about 8.5 nm.

The fraction of the first quantum dots in the plurality of the quantum dots may be greater than or equal to about 80%.

The quantum dot composite or the quantum dot composition of an embodiment may address an overshoot phenomenon that may occur otherwise during operation of a device, and thus a display device including the same may keep an improved level of color reproducibility.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
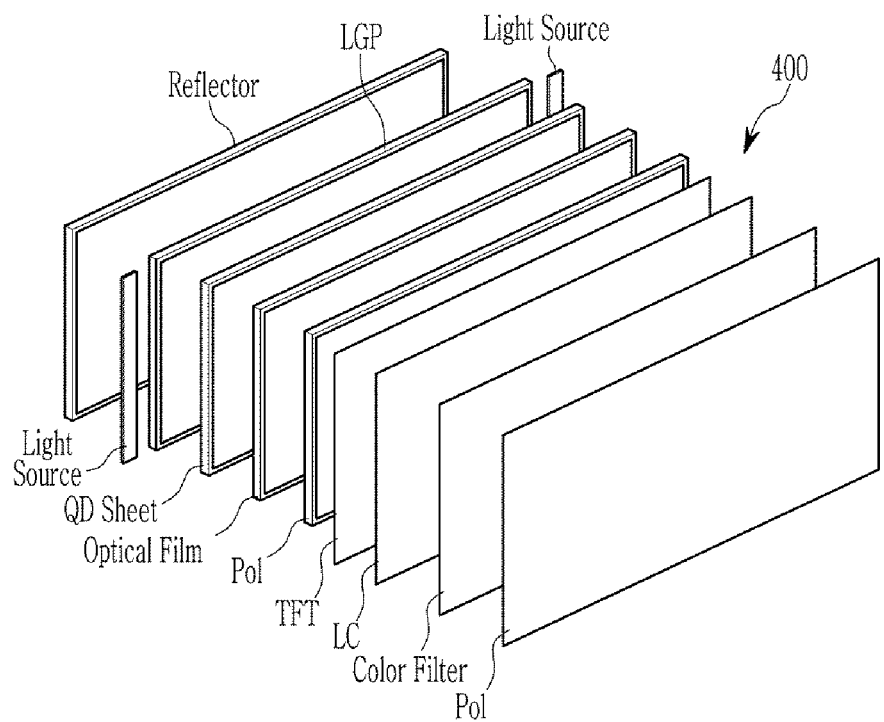
FIG. 1 is an exploded view of a display device of an embodiment.

Advantages and characteristics of this disclosure, and a method for achieving the same, will become evident referring to the following example embodiments together with the drawings attached hereto. However, the embodiments should not be construed as being limited to the embodiments set forth herein. Rather, these embodiments are provided so that this disclosure will be thorough and complete, and will fully convey the scope of the invention to those skilled in the art. Like reference numerals refer to like elements throughout.

If not defined otherwise, all terms (including technical and scientific terms) in the specification may be defined as commonly understood by one skilled in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

The terminology used herein is for the purpose of describing particular embodiments only and is not intended to be limiting. As used herein, the singular forms "a," "an," and "the" are intended to include the plural forms, including "at least one," unless the context clearly indicates otherwise. "At least one" is not to be construed as limiting "a" or "an." "or" means "and/or." As used herein, the term "and/or" includes any and all combinations of one or more of the associated listed items. In addition, unless explicitly described to the contrary, the word "comprise" and variations such as "comprises" or "comprising" will be understood to imply the inclusion of stated elements but not the exclusion of any other elements. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10% or ±5% of the stated value.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer, or section from another element, component, region, layer, or section. Thus, "a first element," "component," "region," "layer," or "section" discussed below could be termed a second element, component, region, layer, or section without departing from the teachings herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, unless a definition is otherwise provided, the term "substituted" refers to a compound or a group or a moiety wherein at least one hydrogen atom thereof is substituted with a substituent. The substituent may include a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C40 heteroaryl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group (—NO$_2$), a cyano group (—CN), an amino group or amine group (—NRR', wherein R and R' are the same or different, and are independently hydrogen or a C1 to C6 alkyl group), an azido group (—N$_3$), an amidino group (—C(=NH)NH$_2$), a hydrazino group (—NHNH$_2$), a hydrazono group (=N(NH$_2$)), an aldehyde group (—C(=O)H), a carbamoyl group (—C(O)NH$_2$), a thiol group (—SH), an ester group (—C(=O)OR, wherein R is a C1 to C6 alkyl group or a C6 to C12 aryl group), a carboxylic acid group (—COOH) or a salt thereof (—C(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), or a combination thereof.

As used herein, unless a definition is otherwise provided, the term "hetero" refers to a compound or group that includes at least one (e.g., one to three) heteroatom(s), wherein the heteroatom(s) is each independently N, O, S, Si, P, or a combination thereof.

As used herein, unless a definition is otherwise provided, the term "alkylene group" refers to a straight or branched chain, saturated aliphatic hydrocarbon group having a valence of two or greater. The alkylene group may be optionally substituted with one or more substituents.

As used herein, unless a definition is otherwise provided, the term "arylene group" refers to a functional group having a valence of two or greater and formed by the removal of at least two hydrogen atoms from one or more rings of an aromatic hydrocarbon, wherein the hydrogen atoms may be removed from the same or different rings (preferably different rings), each of which rings may be aromatic or nonaromatic. The arylene group may be optionally substituted with one or more substituents.

As used herein, unless a definition is otherwise provided, the term "aliphatic hydrocarbon" refers to a C1 to C30 linear or branched alkyl group, a C2 to C30 linear or branched alkenyl group, or C2 to C30 linear or branched alkynyl group, the term "aromatic hydrocarbon group" refers to a C6 to C30 aryl group or a C2 to C30 heteroaryl group, and the term "alicyclic hydrocarbon group" refers to a C3 to C30 cycloalkyl group, a C3 to C30 cycloalkenyl group, or a C3 to C30 cycloalkynyl group.

As used herein, unless a definition is otherwise provided, the term "(meth)acrylate" refers to acrylate, and/or methacrylate, or a combination thereof. The (meth)acrylate may include a (C1 to C10 alkyl)acrylate, a (C1 to C10 alkyl) methacrylate, or a combination thereof.

As used herein, a light conversion efficiency (CE %) refers to a ratio of light amount emitted from a quantum dot composite with respect to light amount absorbed by the composite from incident light (e.g., blue light). A light conversion ratio refers to a percentage of a light emission (A) of a quantum dot composite with respect to excitation light (e.g., blue light) (B). A light absorption ratio refers to a percentage of an amount of light absorbed by a quantum dot composite with respect to an amount of incident light (e.g., blue light). The total light amount (B) of excitation light may be obtained by integration of a photoluminescence (PL) spectrum of the incident light, the PL spectrum of the quantum dot-polymer composite film is measured to obtain a dose (A) of light in a green or red light wavelength region emitted from the quantum dot composite film and a dose (B') of incident light passing through the quantum dot composite film, and a photoconversion efficiency is obtained by the following equation:

$A/B \times 100\%$ = light conversion ratio (%)

$A/(B-B') \times 100\%$ = light conversion efficiency (%)

$(B-B')/B \times 100\%$ = a blue (light)absorption ratio (%).

The quantum efficiency of the quantum dot may be a quantum yield that can be readily and reproducibly measured by any suitable equipment, for example, from Hitachi Co. Ltd or Hamamatsu Co. Ltd and referring to the instruction manuals provided from the manufacturer. In an embodiment, the quantum efficiency (or quantum yield) may be measured in a solution state or a solid state (in a composite). In an embodiment, "quantum yield (or quantum efficiency)" may be a ratio of photons emitted to photons absorbed, e.g., by a nanostructure or population of nanostructures. In an embodiment, the quantum efficiency may be determined by any suitable method. For example, there may be two methods for measuring the fluorescence quantum yield or efficiency: the absolute method and the relative method. The absolute method directly obtains the quantum yield by detecting all sample fluorescence through the use of an integrating sphere. In the relative method, the fluorescence intensity of a standard sample (e.g., a standard dye) may be compared with the fluorescence intensity of an unknown sample to calculate the quantum yield of the unknown sample. Coumarin 153, Coumarin 545, Rhodamine 101 inner salt, Anthracene, and Rhodamine 6G may be used as standard dye, depending on the photoluminescence (PL) wavelengths, but are not limited thereto.

The full width at half maximum (FWHM) and the maximum PL peak wavelength may be determined by a photoluminescent spectrum obtained by a spectrophotometer (or Fluorescence Spectrophotometer).

As used herein, the expression "not including cadmium (or other harmful heavy metal)" may refer to the case in which a concentration of cadmium (or other harmful heavy metal) may be less than or equal to about 100 parts per million by weight (ppmw), less than or equal to about 50 ppmw, less than or equal to about 10 ppmw, less than or equal to about 1 ppmw, less than or equal to about 0.1 ppmw, less than or equal to about 0.01 ppmw, or about zero. In an embodiment, substantially no amount of cadmium (or other harmful heavy metal) may be present or, if present, an amount of cadmium (or other harmful heavy metal) may be less than or equal to a detection limit or as an impurity level of a given analysis tool (e.g., an inductively coupled plasma atomic emission spectroscopy).

As used herein, the term "first absorption peak wavelength" refers to a wavelength of a main excitonic peak appearing first from the longest wavelength region of a UV-vis absorption spectrum of a quantum dot (i.e., appearing in the lowest energy region in the UV-Vis absorption spectrum).

As used herein, unless a definition is otherwise provided, the term "dispersion" refers to a system in which a dispersed phase is a solid and a continuous phase includes a solid or a liquid. For example, the term "dispersion" may refer to a colloidal dispersion, wherein the dispersed phase includes particles having a dimension of at least about 1 nm (e.g., at least about 2 nm, at least about 3 nm, or at least about 4 nm) and less than or equal to about several micrometers (μm) (e.g., 2 μm or less, or 1 μm or less).

A semiconductor nanocrystal particle (also referred to as a quantum dot) is a nanosized crystalline material. The semiconductor nanocrystal particle may have a large surface area per unit volume due to its relatively small size, and therefore, may exhibit different characteristics from bulk materials having the same composition due to a quantum confinement effect. A quantum dot may absorb light from a light source to provide an energy excited state, and upon relaxation to the ground state emit energy corresponding to an energy bandgap of the quantum dot.

The quantum dots have potential applicability in various devices (e.g., an electronic device) due to unique photoluminescence characteristics of the quantum dots.

A quantum dot having properties applicable to an electronic device may be cadmium-based. However, cadmium may cause a serious environment/health problem and thus is a restricted element. Therefore, a use of a cadmium free quantum dot such as a Group III-V-based nanocrystal particle may be desired. In an embodiment, a cadmium free quantum dot showing an enhanced blue light absorption ratio per a given weight, an improved luminance, and/or having an increase in thermal stability may be technologically of interest or desired.

A core comprising a Group III-V compound including indium and phosphorus may be coated with a shell (e.g., a ZnSe and ZnS shell) and then may be formed into a composite in order to be used in a device. However, the present inventors have identified or recognized that a difference in a lattice constant between a ZnS outermost shell and an indium phosphide core is so large that forming a uniform coating on the core may be difficult to achieve, and thus, there is a technological limit in increasing a thickness of a shell.

In addition, the present inventors have identified or recognized that when quantum dots emit light of a desired wavelength (e.g., red light) and have a shell of a limited thickness, the quantum dots included in a quantum dot composite may exhibit an overshoot phenomenon. The overshoot phenomenon refers to the case where a device including a quantum dot composite exhibits an increase (e.g., a gradual or continuous increase) in its luminance over a given operation time such that the increase in the luminance exceeds a predetermined value (e.g., 1.2 percent (%) of an initial luminance) of the device. For example, if the initial luminance is 100%, a luminance of the device showing the overshoot phenomenon may be 101.2% or higher at a predetermined operation time (e.g., of greater than or equal to about 100 hours, greater than or equal to about 150 hours, greater than or equal to about 200 hours, greater than or equal to about 250 hours, or greater than or equal to about 300 hours).

The overshoot phenomenon may lead to an undesired change in color coordinates of a light emitting device. The present inventors have identified that a quantum dot composite that emits in the red region of the visible spectrum may tend to exhibit or suffer from the overshoot phenomenon resulting in a red shift of desired color coordinates of a light emitting device. The present inventors have also identified that when a devices includes a quantum dot composites that emit red light as well as a quantum dot composite that emit light other than red light (e.g., green light and/or blue light), the quantum dot composite that emit the light other than red tends not to exhibit the overshoot phenomenon. Instead, the quantum dot composite that emit the light other than red may tend to exhibit a luminance decrease over time of operation. As a result, a difference between the luminance of the red pixel and the luminance of the other color pixels may continually increase over time of operation, and therefore, the device may not emit the desired color coordinates over an extended time of operation.

The overshoot phenomenon and the drawbacks resulting from the overshoot phenomenon may be addressed by a quantum dot composite of an embodiment. In an embodiment, a quantum dot composite includes a matrix and a plurality of quantum dots dispersed in the matrix, wherein the plurality of quantum dots include a semiconductor nanocrystal core including indium (In) and phosphorous (P), and a semiconductor nanocrystal shell disposed on the semiconductor nanocrystal core, the semiconductor nanocrystal shell including zinc, selenium, and sulfur, wherein an arithmetic size of the plurality of quantum dots is greater than or equal to about 8.0 nanometers (nm), or greater than or equal to about 8.3 nm. In an embodiment, a composition comprises a plurality of quantum dots, wherein the plurality of quantum dots include a first semiconductor nanocrystal including a compound including indium and phosphorus (e.g., an indium phosphide) and a second semiconductor nanocrystal including a zinc chalcogenide. The zinc chalcogenide may include zinc; and selenium, sulfur, or a combination thereof. An arithmetic size of the plurality of quantum dots is greater than or equal to about 8.0 nm. The plurality of quantum dots may include second quantum dots (e.g., a second quantum dot population) with a second arithmetic size, and the second arithmetic size may be less than or equal to about 7.2 nm. A fraction of the second quantum dots in the plurality of quantum dots may be less than or equal to about 18%.

The matrix of the quantum dot composition may include a polymerizable monomer including a carbon-carbon double bond, a thiol compound having at least one thiol group, a polymer, a liquid vehicle (e.g., an organic solvent), or a combination thereof. The quantum dot composition may provide the quantum dot composite of an embodiment in the solid state, for example, via a polymerization.

In an embodiment, a luminance increase of the quantum dot composite may be (or suppressed or controlled to be) less than or equal to about 1.2% of an initial luminance if the quantum dot composite of the embodiment is irradiated with light of a wavelength of from about 450 nm to about 470 nm (for example, in a solid state) for a time period of less than or equal to about 500 hours (e.g., about 400 hours or less, about 300 hours or less, about 250 hours or less, about 210 hours or less, about 200 hours or less, about 150 hours or less, about 100 hours or less, or in a combined range of the foregoing).

As used herein, a luminance change (for example, a luminance increase or a luminance decrease interval) may be determined by an operation reliability test for the composite or a device including the same. In the reliability test of an embodiment, a composite may be irradiated using a light source (e.g., a backlight unit having a predetermined intensity (e.g., 1500 nit ($cd/m^2$) at a predetermined wavelength (e.g., 450 nm to about 470) for example, at a predetermined temperature (e.g., of about 60° C.) and in air.

In a quantum dot composite of an embodiment, the plurality of quantum dots may have an arithmetic size (e.g., an arithmetic size of a population of quantum dots). The arithmetic size may be greater than or equal to about 8.1 nm, greater than or equal to about 8.2 nm, greater than or equal to about 8.3 nm, greater than or equal to about 8.4 nm, greater than or equal to about 8.5 nm, greater than or equal to about 8.6 nm, greater than or equal to about 8.7 nm, greater than or equal to about 8.8 nm, greater than or equal to about 8.9 nm, greater than or equal to about 9.0 nm, greater than or equal to about 9.1 nm, greater than or equal to about 9.2 nm, greater than or equal to about 9.3 nm, greater than or equal to about 9.4 nm, greater than or equal to about 9.5 nm, or any of the aforementioned ranges. The arithmetic size may be less than or equal to about 15 nm, less than or equal to about 14 nm, less than or equal to about 13 nm, less than or equal to about 12 nm, less than or equal to about 11 nm, less than or equal to about 10.5 nm, less than or equal to about 10 nm, or any of the aforementioned ranges. The arithmetic size may be in any of the combined ranges of the aforementioned boundary values (for example, about 8.1 nm to about 15 nm, about 8.5 nm to about 12 nm, about 8.7 nm to about 11 nm, about 8.8 nm to about nm, about 8.9 nm to about 10.5 nm, about 9 nm to about 9.5 nm, or about 9.1 nm to about 9.4 nm).

As used herein, a term "arithmetic size" refers to a size of a given population of quantum dots and can be determined from the core size and shell thickness. The core size is determined from a core composition of the quantum dots and an optical property (e.g., an UV absorption wavelength such as a first absorption peak wavelength). The shell thickness is determined from the core size and the composition of the quantum dots. The composition of the core or the composition of the quantum dots may be determined by an appropriate analysis tool such as an inductively coupled plasma atomic emission spectroscopy.

In an embodiment, for a given quantum dot, the size of the core is determined by a method using the composition of the core and an UV-Visible absorption wavelength. The method of measurement is described in Nanotechnology 24 (2013) 215201 (5 pp), the entire content of which is herein incorporated by reference.

In an embodiment, if a given quantum dot includes a core of an indium phosphide or an alloy thereof, a bandgap energy thereof is greater than or equal to about 2 electron Volts (eV) and less than or equal to about 4.8 eV and a core size may be determined in a range of greater than or equal to about 1 nm and less than or equal to about 4.5 nm. For example, quantum dots having indium phosphide based cores may have a UV absorption wavelength (e.g., the first absorption peak wavelength) of about 570 nm, the size of the core may be determined to be about 3.6 nm. The core may not include zinc.

Under the assumption that a given quantum dot has a spherical shape, a shell thickness for the quantum dots may be arithmetically determined by using the following information together with the measured mole ratios of the chalcogen elements (e.g., sulfur and selenium) with respect to indium in the quantum dots:

a core size (i.e. a core diameter) and a volume of the core calculated from the core diameter; a bulk density and a molar mass of the core component (e.g., a bulk density of the indium phosphide=4.81 g/cm$^3$ and a molar mass of InP=145.79 g/mol); a mole number of the indium included in a given core, which is calculated from the bulk density and the molar mass of the core component; a shell volume if a ZnS or ZnSe shell having a predetermined thickness is formed on the core; and a bulk density and a molar mass of each of the shell components (for example, ZnS and/or ZnSe) (for example, ZnSe=5.27 g/cm$^3$ and 144.35 g/mol, ZnS=4.090 g/cm$^3$ and 97.474 g/mol).

From the above information and under an assumption of that the quantum dot is in the form of a sphere, a mole ratio of each of the chalcogen element components (for example, sulfur or selenium) of the chalcogenide shell having a predetermined thickness with respect to indium in the core having a predetermined diameter may be calculated, from which, information about a shell thickness for a given core diameter may be determined.

The present inventors have found that in a quantum dot composite including a plurality of quantum dot having an indium phosphide core and a ZnSe/ZnS shell or ZnSeS shell, controlling the arithmetic size of the quantum dots (e.g., first quantum dots, second quantum dots, or a combination thereof) as described herein may suppress and/or prevent the overshoot phenomenon that may otherwise occur in the operation of a device that includes a quantum dot composite. Without wishing to be bound by any theory, it is believed that quantum dots having a relatively small arithmetic size or a faction thereof (e.g., second quantum dot population) can make a major contribution to the overshoot phenomenon. If the quantum dots are prepared in a bottom up approach and layers may be formed on the core, a population of resulting quantum dots may tend to have non-uniformity as a whole. Again, without wishing to be bound by any theory, the nonuniformity may contribute substantially to the overshoot phenomenon when the quantum dots emit light of a predetermined light (e.g., red light) in particular, at an early stage of time of operation of a device. The present inventors have identified or recognized that for a given population of the plurality of quantum dots, controlling the (first and/or second) arithmetic size of the (first and/or second) quantum dots, respectively, as described herein may suppress (or prevent) the effects caused by the nonuniformity including the contribution to the overshoot phenomenon. Accordingly, the inventors make it possible to minimize, or in some instances, preclude the overshoot phenomenon of the device.

In an embodiment, the plurality of quantum dots may have the above arithmetic size of the population(s). The plurality of quantum dots may include first quantum dots (i.e., a first quantum dot population) having or showing a first arithmetic size that is greater than the arithmetic size of the plurality of quantum dots. In an embodiment, the first arithmetic size may be greater than or equal to 8.5 nm. In the plurality of quantum dots, a fraction (i.e., a quantity fraction such as a number or weight percentage) of the first quantum dots may be greater than or equal to about 60%, greater than or equal to about 65%, greater than or equal to about 70%, greater than or equal to about 75%, greater than or equal to about 80%, greater than or equal to about 81%, greater than or equal to about 82%, greater than or equal to about 83%, greater than or equal to about 84%, or greater than or equal to about 85%, for example, based on a total quantity (number or amount such as weight) of the plurality of quantum dots. As used herein, in reference to a fraction of quantum dots or a population of quantum dots, the term "fraction" refers to a percentage (e.g., a number or weight percentage) of a particular subset of quantum dots based on a total quantity of the plurality of quantum dots included in a composition or composite.

The first arithmetic size of the first quantum dots (i.e., first quantum dot population) may be greater than the arithmetic size of the plurality of quantum dots by at least about 1%, for example, greater than or equal to about 2%, greater than or equal to about 3%, greater than or equal to about 4%, greater than or equal to about 5% of the arithmetic size of the plurality of the quantum dots. The first arithmetic size of the first quantum dots may be greater than the arithmetic size of the plurality of quantum dots by in a range of about 1% to about 5%, of about 2% to about 4%, or of about 3% or to about 5%. In an embodiment, the arithmetic size of the plurality of quantum dots may be greater than or equal to about 8.8 nm, and/or in an embodiment, the first arithmetic size may be greater than or equal to about 8.9 nm, greater than or equal to about 9.0 nm, greater than or equal to about 9.1 nm, or greater than or equal to about 9.2 nm and/or less than or equal to about nm, less than or equal to about 9.8 nm, or less than or equal to about 9.7 nm, less than or equal to about 9.6 nm, or less than or equal to about 9.5 nm.

In an embodiment, the arithmetic size of the plurality of quantum dots may be greater than or equal to about 9.1 nm, and/or in an embodiment, the first arithmetic size may be greater than or equal to about 9.2 nm, greater than or equal to about 9.3 nm, greater than or equal to about 9.4 nm, or greater than or equal to about 9.5 nm and/or less than or equal to about 11.0 nm, less than or equal to about 10.5 nm, less than or equal to about 10.0 nm, less than or equal to about 9.8 nm, less than or equal to about 9.7 nm, less than or equal to about 9.6 nm, or less than or equal to about 9.5 nm.

In the plurality of quantum dots included in the quantum dot composite of an embodiment, the quantity (e.g., number or weight) of second quantum dots (e.g., a second quantum dot population or a second population of quantum dots) having a second arithmetic size that is less than the arithmetic size of the plurality of quantum dots or that is less than or equal to about 7.2 nm may be limited. In the plurality of quantum dots, a quantity fraction (number or weight percentage) of the second quantum dots (e.g., the second quantum dot population) with a second arithmetic size may be less than or equal to about 30%, less than or equal to about 25%, less than or equal to about 20%, less than or equal to about 19%, less than or equal to about 18%, less than or equal to about 17%, less than or equal to about 16%, less than or equal to about 15%, less than or equal to about 14%, less than or equal to about 13%, less than or equal to about 12%, less than or equal to about 11%, or less than or equal to about 10%.

The second arithmetic size may vary or be controlled depending on the arithmetic size of the plurality of quantum dots (i.e., a total population of the quantum dots). In an embodiment, the total population of the quantum dots (i.e., the plurality of the quantum dots) in the composite may have the arithmetic size within any of the aforementioned ranges, and the second arithmetic size may be less than or equal to about 8.7 nm, less than or equal to about 8.6 nm, less than or equal to about 8.5 nm, less than or equal to about 8.4 nm, less than or equal to about 8.3 nm, less than or equal to about 8.2 nm, less than or equal to about 8.1 nm, less than or equal to about 8.0 nm, less than or equal to about 7.9 nm, less than or equal to about 7.8 nm, less than or equal to about 7.7 nm, less than or equal to about 7.6 nm, less than or equal to about 7.5 nm, less than or equal to about 7.4 nm, less than or equal to about 7.3 nm, less than or equal to about 7.2 nm, less than or equal to about 7.1 nm, less than or equal to about 7.0 nm, less than or equal to about 6.9 nm, less than or equal to about 6.8 nm less than or equal to about 6.7 nm, less than or equal to about 6.6 nm, or less than or equal to about 6.5 nm.

In an embodiment, the arithmetic size of the plurality of quantum dots in the quantum dot composite may be in any of the above ranges (for example, greater than or equal to about 8 nm, greater than or equal to about 8.1 nm, greater than or equal to about 8.2 nm, and less than or equal to about 9.3 nm, less than or equal to about 9.2 nm, less than or equal to about 9.1 nm, less than or equal to about 9 nm, or less than or equal to about 8.9 nm, less than or equal to about 8.8 nm, less than or equal to about 8.7 nm, less than or equal to about 8.6 nm, or less than or equal to about 8.5 nm), and the plurality of quantum dots may include a second or third quantum dot population with an arithmetic size of less than or equal to about 7.5 nm, less than or equal to about 7.4 nm, less than or equal to about 7.3 nm, less than or equal to about 7.2 nm, less than or equal to about 7.1 nm, less than or equal to about 7.0 nm, or less than or equal to about 6.5 nm. A fraction of the second quantum dots or the third quantum dots may be less than or equal to about 30%, less than or equal to about 25%, less than or equal to about 20%, less than or equal to about 19%, less than or equal to about 18%, less than or equal to about 17%, less than or equal to about 16%, less than or equal to about 15%, less than or equal to about 14%, less than or equal to about 13%, less than or equal to about 12%, less than or equal to about 11%, less than or equal to about 10%, or less than or equal to about 9%, based on a total number or weight of the plurality of quantum dots.

In an embodiment, the arithmetic size of the plurality of quantum dots in the quantum dot composite may be in any of the above ranges (e.g., greater than or equal to about 8.2 nm, greater than or equal to about 8.5 nm, greater than or equal to about 9.0 nm, greater than or equal to about 9.1 nm, or greater than or equal to about 9.15 nm). In an embodiment, the arithmetic size of the plurality of quantum dots in the quantum dot composite may be less than or equal to about 9.3 nm, less than or equal to about 9.2 nm, or less than or equal to about 9 nm (for example, from about 8 nm to about 9.3 nm, from about 8.2 nm to about 9.2 nm, from about 8.5 nm to about 9.0 nm, from about 8.6 nm to about 8.9 nm, or from about 8.8 nm to about 9.2 nm), and the first arithmetic size of the first quantum dots included in the plurality of the quantum dots may be greater than or equal to about 8.9 nm, or greater than or equal to about 9 nm. In the plurality of quantum dots (e.g., a total population of the plurality of the quantum dots), a fraction of a first quantum dot population may be greater than or equal to about 60%, greater than or equal to about 65%, greater than or equal to about 70%, greater than or equal to about 75%, greater than or equal to about 80%, greater than or equal to about 81%, or greater than or equal to about 82%.

In the plurality of quantum dots, the first quantum dots, the second quantum dots, and/or the third quantum dots may be separated out via precipitation using an appropriate precipitation solvent (for example, a mixture of a nonsolvent and a dispersing solvent). Details of the non-solvent, the dispersing solvent, and the separation are described or explained herein (e.g., in relation to a method of the quantum dots and/or the Examples).

In the plurality of quantum dots, the semiconductor nanocrystal core (e.g., a size thereof) may control an emission wavelength of the quantum dots. In an embodiment, the quantum dot composite is configured to emit red light, and an average size of the cores may be greater than or equal to about 3.0 nm, for example, greater than or equal to about 3.1 nm, greater than or equal to about 3.2 nm, greater than or equal to about 3.3 nm, greater than or equal to about 3.4 nm, or greater than or equal to about 3.5 nm. In the plurality of the quantum dots, the size of the semiconductor nanocrystal core may be less than or equal to about 4.5 nm, less than or equal to about 4.0 nm, less than or equal to about 3.9 nm, less than or equal to about 3.8 nm, less than or equal to about 3.7 nm, or less than or equal to about 3.6 nm.

In the plurality of quantum dots that are included in the composite, the semiconductor nanocrystal shell may have a multi-layered shell structure. The semiconductor nanocrystal shell may have a first layer including a first semiconductor nanocrystal including zinc, selenium, and optionally sulfur, and a second layer including a second semiconductor nanocrystal including zinc, sulfur, and optionally selenium. The first semiconductor nanocrystal of the first layer may have a composition different from a composition of the second semiconductor nanocrystal of the second layer.

The first layer may include ZnSe, ZnSeS, or a combination thereof. The first layer may be adjacent to (e.g., disposed directly on) the semiconductor nanocrystal core. The first layer may not include sulfur. The second layer may include ZnS. The second layer may consist of ZnS. The second layer may be the outermost layer of the semiconductor nanocrystal shell (or the quantum dot). A thickness of the first layer (or the semiconductor nanocrystal shell) may be greater than or equal to about 1.5 nm, greater than or equal to about 1.7 nm, greater than or equal to about 1.9 nm, greater than or equal to about 2.0 nm, or greater than or equal to about 2.1 nm. A thickness of the first layer (or the semiconductor nanocrystal shell) may be less than or equal to about 5.0 nm, less than or equal to about 4.0 nm, less than or equal to about 3.5 nm, less than or equal to about 3.0 nm, or less than or equal to about 2.5 nm.

If present, a thickness of the second layer may be less than or equal to about 0.7 nm, less than or equal to about 0.6 nm, or less than or equal to about 0.5 nm. In an embodiment, a thickness of the second layer may be greater than or equal to about 0.3 nm, greater than or equal to about 0.35 nm, or greater than or equal to about 0.4 nm.

In the plurality of quantum dots (or in the first quantum dots or the second quantum dots), a mole ratio of zinc with respect to indium (Zn:In) may be greater than or equal to about 13:1, greater than or equal to about 14:1, greater than or equal to about 14.8:1, greater than or equal to about 15:1, greater than or equal to about 15.2:1, greater than or equal to about 15.5:1, greater than or equal to about 16:1, greater than or equal to about 16.2:1, greater than or equal to about 16.5:1, greater than or equal to about 17:1, greater than or equal to about 17.2:1, greater than or equal to about 17.5:1, or greater than or equal to about 18:1. In the plurality of quantum dots (or the first quantum dots and/or the second quantum dots), a mole ratio of zinc with respect to indium may be less than or equal to about 50:1, less than or equal to about 40:1, less than or equal to about 30:1, less than or equal to about 25:1, less than or equal to about 20:1, less than or equal to about 19:1, less than or equal to about 18:1, or less than or equal to about 16.5:1.

In the plurality of quantum dots (or the first quantum dots or the second quantum dots), a mole ratio of sulfur with respect to selenium (S:Se) may be less than or equal to about 2:1, less than or equal to about 1.5:1, less than or equal to about 1:1, less than or equal to about 0.9:1, less than or equal to about 0.8:1, less than or equal to about 0.7:1, less than or equal to about 0.6:1, less than or equal to about 0.5:1, or less than or equal to about 0.4:1. In the plurality of quantum dots (or the first quantum dots or the second quantum dots), a mole ratio of sulfur with respect to selenium (S:Se) may be greater than or equal to about 0.1:1, greater than or equal to about 0.2:1, or greater than or equal to about 0.3:1.

In the plurality of quantum dots (or the first quantum dots or the second quantum dots), a mole ratio of phosphorus with respect to indium (P:In) may be greater than or equal to about 0.5:1, greater than or equal to about 0.6:1, greater than or equal to about 0.7:1, greater than or equal to about 0.72:1, greater than or equal to about 0.75:1, or greater than or equal to about 0.8:1. In the plurality of quantum dots (or the first quantum dots or the second quantum dots), a mole ratio of phosphorus with respect to indium (P:In) may be less than or equal to about 1:1, less than or equal to about 0.9:1, less than or equal to about 0.85:1, or less than or equal to about 0.8:1.

In the plurality of quantum dots (or the first quantum dots or the second quantum dots), a mole ratio of selenium with respect to indium (Se:In) may be greater than or equal to about 6:1, greater than or equal to about 6.5:1, greater than or equal to about 7:1, greater than or equal to about 7.5:1, greater than or equal to about 8:1, greater than or equal to about 8.5:1, greater than or equal to about 8.8:1, greater than or equal to about 9:1, greater than or equal to about 9.1:1, greater than or equal to about 9.5:1, greater than or equal to about 10:1, greater than or equal to about 10.5:1, or greater than or equal to about 11:1. In the plurality of quantum dots (or the first quantum dots or the second quantum dots), a mole ratio of selenium with respect to indium may be less than or equal to about 20:1, less than or equal to about 18:1, less than or equal to about 16:1, less than or equal to about 14:1, or less than or equal to about 13:1.

In the plurality of quantum dots (or the first quantum dots or the second quantum dots), a mole ratio of sulfur with respect to indium (S:In) may be greater than or equal to about 2.5:1, greater than or equal to about 2.6:1, greater than or equal to about 2.7:1, greater than or equal to about 2.8:1, greater than or equal to about 2.9:1, greater than or equal to about 3:1, greater than or equal to about 3.5:1, greater than or equal to about 3.6:1, greater than or equal to about 3.7:1, greater than or equal to about 3.8:1, greater than or equal to about 3.9:1, greater than or equal to about 4:1, or greater than or equal to about 4.4:1. In the plurality of quantum dots (or the first quantum dots or the second quantum dots), a mole ratio of sulfur with respect to indium may be less than or equal to about 10:1, less than or equal to about 9:1, less than or equal to about 8:1, less than or equal to about 7:1, less than or equal to about 6.5:1, less than or equal to about 6:1, less than or equal to about 5.5:1, less than or equal to about 5:1, or less than or equal to about 4.9:1.

In the plurality of quantum dots (or the first quantum dots or the second quantum dots), a mole ratio of a total sum of selenium and sulfur with respect to indium ((Se+S):In) may be greater than or equal to about 10:1, greater than or equal to about 11:1, greater than or equal to about 12:1, greater than or equal to about 13:1, greater than or equal to about 13.5:1, greater than or equal to about 14:1, greater than or equal to about 14.5:1, or greater than or equal to about 15:1. In the plurality of quantum dots (or the first quantum dots or the second quantum dots), a mole ratio of a total sum of selenium and sulfur with respect to indium may be less than or equal to about 30:1, less than or equal to about 25:1, less than or equal to about 20:1, less than or equal to about 18:1, less than or equal to about 17:1, less than or equal to about 16:1, or less than or equal to about 15.5:1.

In the plurality of quantum dots (or the first quantum dots or the second quantum dots), a mole ratio of zinc with respect to a total sum of selenium and sulfur (Zn:(Se+S)) may be less than or equal to about 1.3:1, less than or equal to about 1.2:1, less than or equal to about 1.1:1, less than or equal to about 1.09:1, less than or equal to about 1.08:1, less than or equal to about 1.07:1, less than or equal to about 1.06:1. In the plurality of quantum dots (or the first quantum dots or the second quantum dots), a mole ratio of zinc with respect to a total sum of selenium and sulfur may be greater than or equal to about 0.5:1, greater than or equal to about 0.6:1, greater than or equal to about 0.7:1, greater than or equal to about 0.8:1, greater than or equal to about 0.9:1, or greater than or equal to about 1:1.

The plurality of quantum dots may have an arithmetic size in the above range and may have irregular shapes.

Therefore, in an embodiment, the shapes of the plurality of quantum dots may be so irregular that an (average) solidity or an average circularity of the quantum dots may not be obtainable.

In an embodiment, a quantum dot composition or composite includes the plurality of quantum dots set forth above, and in a solid state, the quantum dot composition or composite may exhibit a luminance decrease interval if irradiated with light of a wavelength of from about 450 nm to about 470 nm (for example, in a solid state) for a predetermined time. In an embodiment, the luminance decrease interval may appear within a irradiation time of less than or equal to about 100 hours, less than or equal to about 90 hours, less than or equal to about 80 hours, less than or equal to about 70 hours, less than or equal to about 60 hours, or less than or equal to about 50 hours. In the luminance decrease interval, the lowest value of the luminance may be 98% of the initial luminance, e.g., greater than or equal to about 98.5%, or greater than or equal to about 99%, of the initial luminance.

The quantum dot composite or composition, or the plurality of the quantum dots included therein may be configured to emit red light. A maximum peak wavelength of the red light may be greater than or equal to about 600 nm, greater than or equal to about 610 nm, greater than or equal to about 620 nm, or greater than or equal to about 625 nm. A maximum peak wavelength of the red light may be less than or equal to about 650 nm, less than or equal to about 645 nm, less than or equal to about 640 nm, or less than or equal to about 635 nm.

A quantum yield or efficiency of the quantum dot composite or composition, or the plurality of quantum dots may be greater than or equal to about 85%, greater than or equal to about 86%, greater than or equal to about 87%, greater than or equal to about 88%, greater than or equal to about 89%, or greater than or equal to about 90%. The quantum yield or efficiency of the quantum dot composite or composition, or the plurality of quantum dots may be readily measured by an absolute method or a relative method using a commercially available fluorescence spectrophotometer or a Quantum Yield spectroscopy analyzer.

In an embodiment, the quantum dot composite or composition, or the plurality of quantum dots (or a quantum dot population) may show a full width at half maximum of less than 41 nm, for example, less than or equal to about 40 nm, less than or equal to about 39 nm, less than or equal to about 38 nm, or less than or equal to about 37 nm.

In an embodiment, in the plurality of quantum dots, a mole ratio of zinc with respect to indium may be greater than or equal to about 13:1, and a mole ratio of sulfur with respect to selenium may be less than or equal to about 0.5:1; and the plurality of quantum dots comprising the first quantum dot population and the second quantum dot population may have an arithmetic size of greater than 8.0 nanometers, and the sum fraction of the first and the second quantum dot populations may be greater than 85% of the plurality of quantum dots.

A quantum dot-based display device may exhibit improved color purity, luminance, and the like. For example, a liquid crystal display (hereinafter, LCD) realizes colors by polarized light passing an absorption type color filter after the lights has passed through a liquid crystal. LCDs have a drawback of a narrow viewing angle and low light transmittance due to the absorption type color filter. A quantum dot may emit light having theoretical quantum efficiency or quantum yield (QY) of about 100% and high color purity (e.g., less than or equal to about 40 nm of a full width at half maximum (FWHM)), and thus, achieve increased luminous efficiency and improved color reproducibility. The absorption type color filter may be replaced with a photoluminescent type color filter including quantum dot composite to realize a wider viewing angle and improved luminance.

The quantum dots may be dispersed in a host matrix (e.g., including a polymer, an inorganic material, or a combination thereof) to form a quantum dot composite, which can be applied to a device. The plurality of quantum dots may show improved optical properties and process stability, and accordingly, if included in a display device as a quantum dot polymer composite or a patterned quantum dot polymer composite, improved luminance, a wide viewing angle, and improved color reproducibility may be achieved. The plurality of quantum dots of an embodiment may maintain an improved level of color reproducibility under a BT 2020, a next generation standard for a display device.

The quantum dot may include an organic ligand, an organic solvent, or a combination thereof, which will be described below, on a surface of the quantum dot. The organic ligand, the organic solvent, or a combination thereof may be bound to the surface of the quantum dot.

The plurality of quantum dots included in a quantum dot composite of an embodiment may be prepared by a method described herein. The method includes reacting a zinc precursor with a selenium precursor and a sulfur precursor in the presence of a semiconductor nanocrystal core including indium and phosphorus in a heated mixture of an organic solvent and an organic ligand (for example, a predetermined time), wherein a size and an amount of the semiconductor nanocrystal core, amounts of the precursors (and if desired, a mole ratio between each components and/or a reaction time) are controlled to achieve the above features (e.g., the arithmetic size, the first arithmetic size, the second arithmetic size, a mole ratio between the elements included in the quantum dots, or a combination thereof).

In an embodiment, a method of producing the aforementioned quantum dot may include:
  obtaining a first mixture including a zinc precursor, an organic ligand, and an organic solvent;
  optionally heating the first mixture;
  injecting a semiconductor nanocrystal core including indium and phosphorous, and a selenium precursor to the (optionally heated) first mixture to obtain a second mixture;
  heating the second mixture at a first temperature and keeping the second mixture at the first reaction temperature, for example, for at least about 40 minutes, for example, at least about 50 minutes, to obtain a third mixture including a particle including a first semiconductor nanocrystal shell including zinc and selenium formed on the semiconductor nanocrystal core;
  injecting a sulfur precursor (e.g., a stock solution including the sulfur containing precursor) into the third mixture at the first reaction temperature and conduct a reaction to form a second semiconductor nanocrystal shell on the first semiconductor nanocrystal shell. In the method of the embodiment, an amount of the selenium precursor and an amount of the sulfur precursor with respect to the core in the second mixture and the third mixture may be controlled, respectively, and optionally controlling a duration of a reaction in each step, in order to provide a quantum dot to satisfy the aforementioned shell composition.

If desired, in order to obtain a desired arithmetic size and/or distribution, e.g., a fraction of the first and/or second quantum dot populations, a plurality of quantum dots as prepared may undergo a process of reprecipitation by adding a precipitation solvent (prepared by mixing a dispersing solvent and a non-solvent at a predetermined ratio) to a crude solution including the plurality of quantum dots dispersed in an organic solvent. The step of reprecipitation may be repeated (e.g., at least twice, at least three times, at least four times, or at least five times). In the precipitation solvent, a volume ratio of the non-solvent with respect to the dispersing solvent may be greater than or equal to about 1:1, greater than or equal to about 1.2:1, greater than or equal to about 1.3:1, greater than or equal to about 1.4:1, greater than or equal to about 1.5:1, greater than or equal to about 1.6:1, greater than or equal to about 1.7:1, greater than or equal to about 1.8:1, greater than or equal to about 1.9:1, greater than or equal to about 2:1, greater than or equal to about 2.1:1, greater than or equal to about 2.2:1, greater than or equal to about 2.3:1, or greater than or equal to about 2.4:1. In the precipitation solvent, a volume ratio of the non-solvent with respect to the dispersing solvent may be less than or equal to about 5:1, less than or equal to about 4:1, less than or equal to about 3.5:1, less than or equal to about 3:1, or less than or equal to about 2.5:1.

Details of the semiconductor nanocrystal core are the same as set forth above. The semiconductor nanocrystal core may be prepared by reacting an indium precursor and a phosphorus precursor in an organic solvent and in the presence of an organic ligand at a core formation temperature for a predetermined time. In an embodiment, prior to injecting the precursors to a reaction system, the organic solvent and the organic ligand may be first mixed and pre-treated (e.g., heated to a predetermined temperature (e.g., of greater than or equal to about 100° C., for example, greater than or equal to about 120° C., greater than or equal to about 150° C.) and less than or equal to about the core formation temperature under vacuum, an inert atmosphere, or a combination thereof). If desired, a zinc precursor may be added to the formation of the core. In an embodiment, the core may be synthesized by injecting a solution including a metal precursor (e.g., an indium precursor), and optionally, a ligand is heated at a high temperature (e.g., of greater than or equal to about 200° C.), and then, a phosphorous precursor is injected into the heated solution. The prepared core may be separated from the reaction system by precipitation using a non-solvent that will be described in detail below, and the separated cores are then added to a reaction system for forming a shell on the core. The prepared core may be added (e.g., injected) to a heated organic solvent at a temperature of greater than or equal to about 100° C.

An organic solvent and an organic ligand may be pre-treated for a shell forming reaction. The core may be added (e.g., injected) to the pre-treated reaction system and shell precursors (e.g., the zinc precursor, the selenium precursor, and the sulfur precursor) may be added and the shell forming reaction may be carried out. The added amount and order of the precursors may be controlled taking into consideration a desired shell composition. In an embodiment, the shell formation may include injecting the zinc precursor and then the selenium precursor to carry out a reaction at a first temperature and to form a first layer; and then injecting the sulfur precursor optionally with an additional amount of the zinc precursor to the reaction system to carry out a reaction at a second temperature and to form a second layer.

The organic ligand may include $RCOOH$, $RNH_2$, $R_2NH$, $R_3N$, $RSH$, $RH_2PO$, $R_2HPO$, $R_3PO$, $RH_2P$, $R_2HP$, $R_3P$, $ROH$, $RCOOR'$, $RPO(OH)_2$, $RHPOOH$, $R_2POOH$ (wherein R and R' are the same or different, and are independently a hydrogen, a C1 to C40 (or C3 to C24) aliphatic hydrocarbon group (e.g., a alkyl group, a alkenyl group, or a alkynyl group), a C6 to C40 aromatic hydrocarbon group (such as a C6 to C20 aryl group)), a polymeric organic ligand, or a combination thereof. The organic ligand may coordinate to, e.g., be bound to, the surface of the obtained nanocrystal and help the nanocrystal to be well dispersed in the solution.

Examples of the organic ligand may include methane thiol, ethane thiol, propane thiol, butane thiol, pentane thiol, hexane thiol, octane thiol, dodecane thiol, hexadecane thiol, octadecane thiol, or benzyl thiol; methane amine, ethane amine, propane amine, butyl amine, pentyl amine, hexyl amine, octyl amine, dodecyl amine, hexadecyl amine, octadecyl amine, dimethyl amine, diethyl amine, dipropyl amine; methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, or benzoic acid; phosphine such as substituted or unsubstituted methyl phosphine (e.g., trimethyl phosphine, methyldiphenyl phosphine, etc.), substituted or unsubstituted ethyl phosphine (e.g., triethyl phosphine, ethyldiphenyl phosphine, etc.), substituted or unsubstituted propyl phosphine, substituted or unsubstituted butyl phosphine, substituted or unsubstituted pentyl phosphine, or substituted or unsubstituted octylphosphine (e.g., trioctylphosphine (TOP)); phosphine oxide such as substituted or unsubstituted methyl phosphine oxide (e.g., trimethyl phosphine oxide, methyldiphenyl phosphine oxide, etc.), substituted or unsubstituted ethyl phosphine oxide (e.g., triethyl phosphine oxide, ethyldiphenyl phosphine oxide, etc.), substituted or unsubstituted propyl phosphine oxide, substituted or unsubstituted butyl phosphine oxide, or substituted or unsubstituted octyl phosphine oxide (e.g., trioctylphosphine oxide (TOPO); diphenyl phosphine, triphenyl phosphine, diphenyl phosphine oxide, or triphenyl phosphine oxide; an alkylphosphinic acid for example, a C5 to C20 alkyl phosphinic acid (e.g., hexyl phosphinic acid, octyl phosphinic acid, dodecanyl phosphinic acid, tetradecanyl phosphinic acid, hexadecanyl phosphinic acid, octadecanyl phosphinic acid, or the like, an alkylphosphonic acid such as a C5 to C20 alkylphosphonic acid; or the like, but are not limited thereto. The organic ligand may be used alone or as a mixture of at least two ligand compounds.

The organic solvent may a C6 to C22 primary amine such as hexadecylamine; a C6 to C22 secondary amine such as dioctylamine; a C6 to C40 tertiary amine such as trioctylamine; a nitrogen-containing heterocyclic compound such as pyridine; a C6 to C40 aliphatic hydrocarbon (e.g., alkane, alkene, alkyne, etc.) such as hexadecane, octadecane, octadecene, or squalane; a C6 to C30 aromatic hydrocarbon such as phenyldodecane, phenyltetradecane, or phenyl hexadecane; a phosphine substituted with a C6 to C22 alkyl group such as trioctylphosphine; a phosphine oxide substituted with a C6 to C22 alkyl group such as trioctylphosphine oxide; a C12 to C22 aromatic ether such as phenyl ether, or benzyl ether, or a combination thereof. Types and amounts of the organic solvent may be appropriately selected considering precursors and organic ligands. The organic solvent may be a dispersing solvent.

The zinc precursor is not particularly limited and may be selected appropriately. In an embodiment, the zinc precursor may include a Zn metal powder, an alkylated Zn compound (e.g., dimethyl zinc, diethyl zinc, or a combination thereof), a Zn alkoxide, a Zn carboxylate (e.g., zinc acetate), a zinc carbonate, a Zn nitrate, a Zn perchlorate, a Zn sulfate, a Zn acetylacetonate, a Zn halide (e.g., zinc chloride, zinc bromide, zinc iodide, zinc fluoride, or a combination thereof), a Zn cyanide, a Zn hydroxide, a Zn oxide, a Zn peroxide, or a combination thereof. Examples of the zinc precursor may include, but are not limited to dimethyl zinc, diethyl zinc, zinc acetate, zinc acetylacetonate, zinc iodide, zinc bromide, zinc chloride, zinc fluoride, zinc carbonate, zinc cyanide, zinc nitrate, zinc oxide, zinc peroxide, zinc perchlorate, zinc sulfate, zinc oleate, and the like. The zinc containing precursor may be used alone or in a combination of two or more compounds.

The selenium precursor is not particularly limited and may be desirably selected. In an embodiment, the selenium precursor includes selenium-trioctyl phosphine (Se-TOP), selenium-tributyl phosphine (Se-TBP), selenium-triphenyl phosphine (Se-TPP), or a combination thereof but is not limited thereto.

The first reaction temperature may be selected appropriately and, for example, may be greater than or equal to about 280° C., greater than or equal to about 290° C., greater than or equal to about 300° C., greater than or equal to about 310° C., or greater than or equal to about 315° C. and less than or equal to about 390° C., less than or equal to about 380° C., less than or equal to about 370° C., less than or equal to about 360° C., less than or equal to about 350° C., less than or equal to about 340° C., or less than or equal to about 330° C. After or during the heating to the first reaction temperature, a selenium containing precursor may be injected at least one time (e.g., at least twice, at least third times).

The reaction time at the first reaction temperature may be greater than or equal to about 40 minutes, for example, greater than or equal to about 50 minutes, greater than or equal to about 60 minutes, greater than or equal to about 70 minutes, greater than or equal to about 80 minutes, greater than or equal to about 90 minutes, and less than or equal to about 4 hours, for example, less than or equal to about 3 hours, or less than or equal to about 2 hours.

By the reaction at the first reaction temperature for the aforementioned time period, the first semiconductor nanocrystal shell including the zinc and selenium and having a thickness of greater than or equal to about 3 monolayers (ML), greater than or equal to about 4 ML, greater than or equal to about 5 ML, or 6 ML, (and/or less than or equal to about 10 ML, may be formed to provide the third mixture. As used herein, the term "monolayer" may refer to a measurement unit, for example, for a shell thickness derived from the bulk crystal structure of the shell material as the closest distance between relevant lattice planes. For example, the thickness of one monolayer may be determined as the distance between adjacent lattice planes for cubic lattice structure.

In an embodiment, the amount of the selenium precursor with respect to the indium may be controlled such that during the predetermined reaction time, a desired composition of the shell (e.g., the first layer having the predetermined thickness) may be formed. In an embodiment, the added amount of the selenium per one mole of indium in the reaction system may be greater than or equal to about 7 moles, greater than or equal to about 8 moles, greater than or equal to about 9 moles, greater than or equal to about 10 moles, greater than or equal to about 11 moles, greater than or equal to about 12 moles, greater than or equal to about 13 moles, greater than or equal to about 14 moles, or greater than or equal to about 15 moles. In an embodiment, the amount of the selenium per one mole of indium may be less than or equal to about 30 moles, less than or equal to about moles, less than or equal to about 20 moles, less than or equal to about 18 moles, or less than or equal to about 15 moles.

In an embodiment, the method may not include lowering a temperature of the reaction mixture including a particle having the first layer of the semiconductor nanocrystal shell down at or below about 100° C., for example, less than or equal to about 50° C. (e.g., 30° C. or lower, or room temperature). In other words, the method may include maintaining a temperature of a reaction mixture including the particle having the first layer on the core at a temperature of greater than or equal to 100° C., for example, greater than or equal to 50° C., or greater than or equal to 30° C.

Types of the sulfur precursor are not particularly limited and may be selected appropriately. The sulfur precursor may include hexane thiol, octane thiol, decane thiol, dodecane thiol, hexadecane thiol, mercapto propyl silane, sulfur-trioctylphosphine (S-TOP), sulfur-tributylphosphine (S-TBP), sulfur-triphenylphosphine (S-TPP), sulfur-trioctylamine (S-TOA), trimethylsilyl sulfide, sulfide ammonium, sodium sulfide, or a combination thereof. The sulfur precursor may be injected at least one times (e.g., at least two times).

The second reaction temperature may be selected appropriately and, may be greater than or equal to about 280° C., greater than or equal to about 290° C., greater than or equal to about 300° C., greater than or equal to about 310° C., or greater than or equal to about 315° C. The second reaction temperature may be less than or equal to about 350° C., less than or equal to about 340° C., or less than or equal to about 330° C. After or during the heating to the second reaction temperature, the sulfur precursor may be injected at least one time (e.g., at least twice, or at least third times).

The reaction time at the second reaction temperature may be selected appropriately and is not particularly limited. For example, the reaction time at the second reaction temperature may be greater than or equal to about 30 minutes, greater than or equal to about 40 minutes, greater than or equal to about 50 minutes, greater than or equal to about 60 minutes, greater than or equal to about 70 minutes, greater than or equal to about 80 minutes, or greater than or equal to about 90 minutes. In an embodiment, the reaction time at the second reaction temperature may be less than or equal to about 4 hours, less than or equal to about 3 hours, or less than or equal to about 2 hours.

In an embodiment, the amount of the sulfur precursor with respect to the indium may be controlled such that during the predetermined reaction time, a desired composition of the shell (e.g., the second layer having the predetermined thickness) may be formed. In an embodiment, the amount of sulfur with respect to one mole of indium in the reaction system may be greater than or equal to about 3 moles, greater than or equal to about 4 moles, greater than or equal to about 5 moles, greater than or equal to about 6 moles, greater than or equal to about 7 moles, greater than or equal to about 8 moles, greater than or equal to about 9 moles, greater than or equal to about 10 moles, greater than or equal to about 11 moles, greater than or equal to about 12 moles, greater than or equal to about 13 moles, greater than or equal to about 14 moles, greater than or equal to about 15 moles, greater than or equal to about 16 moles, greater than or equal to about 17 moles, greater than or equal to about 18 moles, or greater than or equal to about 19 moles. The amount of sulfur with respect to one mole of indium in the third mixture may be less than or equal to about 40 moles, less than or equal to about moles, less than or equal to about 30 moles, less than or equal to about 25 moles, less than or equal to about 20 moles, or less than or equal to about 15 moles.

The amounts of the zinc precursor, the selenium precursor, and the sulfur precursor with respect to the indium of the semiconductor nanocrystal core may be selected taking into consideration the structure and the properties of the final quantum dot.

After the reaction, a non-solvent is added into the obtained final reaction solution to facilitate precipitation of organic ligand-coordinated quantum dots that may then be separated. The non-solvent may be a polar solvent that is miscible with the solvent used in the reaction. The semiconductor nanocrystals and the quantum dots may not be dispersible in the non-solvent. The non-solvent may be selected depending on the solvent used in the reaction and may be for example, acetone, ethanol, butanol, isopropanol, ethanediol, water, tetrahydrofuran (THF), dimethyl sulfoxide (DMSO), diethyl ether, formaldehyde, acetaldehyde, a solvent having a similar solubility parameter to the foregoing solvents, or a combination thereof. The separation may be performed through a centrifugation, filtration, chromatography, or distillation. The separated semiconductor nanocrystals (or the first and the second semiconductor nanocrystals) may be added to a washing solvent and washed, if desired. The washing solvent is not particularly limited and may include a solvent having a similar solubility parameter to that of the organic solvent or the organic ligand, and, for example, may include an alkane such as hexane, heptane, or octane, chloroform, toluene, benzene, or the like.

The quantum dots or a population of quantum dots may be dispersed in a dispersing solvent. The dispersing solvent is not particularly limited and may be selected appropriately. The dispersing solvent may include (or consist of) the aforementioned organic solvent. The dispersing solvent may include (or consists of) a substituted or unsubstituted C1 to C40 aliphatic hydrocarbon, a substituted or unsubstituted C6 to C40 aromatic hydrocarbon, or a combination thereof. The non-solvent and the dispersing solvent may be used as the precipitation solvent in the process of inducing precipitations (i.e., repreciaption) as set forth above. Separation of the quantum dots following the process of inducing the precipitation may be carried out in a similar method or a substantially the same method as set forth above.

In a quantum dot composite of an embodiment, the plurality of quantum dots may be dispersed in a matrix. In a quantum dot composite of an embodiment, or a composition of an embodiment, including the quantum dots, an amount of the quantum dots may be selected appropriately, for example, in light of a final use thereof (e.g., a color filter).

In an embodiment, the amount of the quantum dots may be greater than or equal to about 1 weight percent (wt %), for example, greater than or equal to about 2 wt %, greater than or equal to about 3 wt %, greater than or equal to about 4 wt %, greater than or equal to about 5 wt %, greater than or equal to about 6 wt %, greater than or equal to about 7 wt %, greater than or equal to about 8 wt %, greater than or equal to about 9 wt %, greater than or equal to about 10 wt %, greater than or equal to about 15 wt %, greater than or equal to about 20 wt %, greater than or equal to about 25 wt %, greater than or equal to about 30 wt %, greater than or equal to about 35 wt %, or greater than or equal to about 40 wt %, based on a total solid content (or a total weight) of the composition or the composite. The amount of the quantum dot may be less than or equal to about 70 wt %, for example, less than or equal to about 65 wt %, less than or equal to about 60 wt %, less than or equal to about 55 wt %, or less than or equal to about 50 wt %, based on a total solid content (or a total weight) of the composite or the composition.

A total solid content (TSC) of the composite or the composition may be greater than or equal to about 10%, greater than or equal to about 15%, greater than or equal to about 20%, greater than or equal to about 25%, greater than or equal to about 30%, greater than or equal to about 35%, greater than or equal to about 40%, greater than or equal to about 45%, greater than or equal to about 50%, greater than or equal to about 55%, greater than or equal to about 60%, or greater than or equal to about 65%. In an embodiment, a total solid content (TSC) of the composite or the composition may be less than or equal to about 90%, less than or equal to about 80%, less than or equal to about 70%, less than or equal to about 60%, less than or equal to about 50%, less than or equal to about 40%, or less than or equal to about 30%.

The matrix of the quantum dot composite (or the composition) may include (or further include) a polymerizable monomer including a carbon-carbon double bond or a polymer thereof, a thiol compound having at least one thiol group, a polymer, a liquid vehicle (e.g., an organic solvent or a volatile liquid), or a combination thereof. The monomer may be a non-volatile liquid compound. The matrix (or the composition) may become a solid state via a polymerization and optionally a drying or removal of a volatile compound (e.g., an organic solvent). The composite or the composition may be a liquid composition. The composition, which may be in liquid form, may further include an initiator for a polymerization of a polymerizable monomer. The composite or the composition may be in a form of a solid film or a liquid film. The film may be a patterned one having a predetermined repeating section, for example, corresponding to a sub-pixel pattern.

In an embodiment, a composition including quantum dots and a matrix component for forming a pattern may be a photoresist composition that may be applicable to a photolithography process or an ink jet composition to produce a pattern via a printing manner (e.g., a liquid drop discharging method such as ink-jet printing). Details of each method will be described herein. The ink composition may include a polymerizable monomer, a liquid vehicle, or a combination thereof. The liquid vehicle may include an organic solvent. In an embodiment, the ink composition may not include a (volatile) organic solvent. The matrix or the composition may include an electrically insulative polymer. The polymerizable monomer may provide an electrically insulative polymer via a polymerization.

The polymerizable monomer may include a (meth)acrylate compound having at least one (meth)acrylate group. If desired, the polymerizable monomer may or may not include a carboxylic acid group. The monomer may include a (photopolymerizable) (meth)acrylate monomer. The monomer may be a precursor for an insulative polymer. Examples of the monomer may include, but are not limited to, a C1-C10-alkyl (meth)acrylate, ethylene glycol di(meth)acrylate, triethylene glycol di(meth)acrylate, diethylene glycol di(meth)acrylate, 1,4-butanediol di(meth)acrylate, 1,6-hexanediol di(meth)acrylate, neopentyl glycol di(meth)acrylate, pentaerythritol di(meth)acrylate, pentaerythritol tri(meth)acrylate, pentaerythritol tetra(meth)acrylate, dipentaerythritol di(meth)acrylate, dipentaerythritol tri(meth)acrylate, dipentaerythritol penta(meth)acrylate, dipentaerythritol hexa(meth)acrylate, bisphenol A epoxy (meth)acrylate, bisphenol A di(meth)acrylate, trimethylolpropane tri(meth)acrylate, ethylene glycol monomethyl ether (meth)acrylate, novolac epoxy (meth)acrylate, propylene glycol di(meth)acrylate, tris(meth)acryloyloxyethyl phosphate, or a combination thereof.

The amount of the (photopolymerizable) monomer may be greater than or equal to about 0.5 wt %, for example, greater than or equal to about 1 wt %, or greater than or equal to about 2 wt % with respect to a total weight (or a total solid content) of the composite or the composition. The amount of the photopolymerizable monomer may be less than or equal to about 50 wt %, for example, less than or equal to about 40 wt %, less than or equal to about 30 wt %, less than or equal to about 28 wt %, less than or equal to about 25 wt %, less than or equal to about 23 wt %, less than or equal to about 20 wt %, less than or equal to about 18 wt %, less than or equal to about 17 wt %, less than or equal to about 16 wt %, or less than or equal to about 15 wt % with respect to a total weight (or a total solid content) of the composite or the composition.

The thiol compound may include a dithiol compound, a trithiol compound, a tetrathiol compound, or a combination thereof. For example, the thiol compound may include glycol di-3-mercaptopropionate (e.g., ethylene glycol di-3-mercaptopropionate), glycol dimercaptoacetate (e.g., ethylene glycol dimercaptoacetate), trimethylolpropane tris(3-mercaptopropionate), pentaerythritol tetrakis(3-mercaptopropionate), pentaerythritol tetrakis(2-mercaptoacetate), 1,6-hexanedithiol, 1,3-propanedithiol, 1,2-ethanedithiol, polyethylene glycol dithiol including 1 to 10 ethylene glycol repeating units, or a combination thereof. Based on a total weight (or a total solid content) of the composition, an amount of the thiol compound may be less than or equal to about 50 wt %, less than or equal to about 40 wt %, less than or equal to about 30 wt %, less than or equal to about 20 wt %, less than or equal to about 10 wt %, less than or equal to about 9 wt %, less than or equal to about 8 wt %, less than or equal to about 7 wt %, less than or equal to about 6 wt %, or less than or equal to about 5 wt %. The amount of the thiol compound may be greater than or equal to about 0.1 wt %, for example, greater than or equal to about 0.5 wt %, greater than or equal to about 1 wt %, greater than or equal to about 5 wt %, greater than or equal to about 10 wt %, or greater than or equal to about 15 wt %, based on a total weight (or a total solid content) of the composition.

The polymer may include a linear polymer, a cross-linked polymer, or a combination thereof. The (linear or cross-linked) polymer may include a polymerization product of the polymerizable monomer. The cross-linked polymer may include a thiolene polymer (for example, including a polymerization product of the above monomer and the thiol compound), a crosslinked poly(meth)acrylate, a crosslinked polyurethane, a crosslinked epoxy resin, a crosslinked vinyl polymer, a crosslinked silicone resin, or a combination thereof. The linear polymer may include a repeating unit derived from a monomer including a carbon-carbon double bond and optionally a carboxylic acid group.

In the quantum dot composite or the composition of an embodiment, the polymerizable monomer or the linear polymer (for example, optionally having a carboxylic acid group) may contribute to dispersing the quantum dots in the composite or the composition. The linear polymer may be an electrically insulative polymer.

The matrix may include a carboxylic acid group containing compound.

The polymerizable monomer or the linear polymer including a carboxylic acid group (hereinafter, a dispersing agent) may include:

a monomer combination including a first monomer including a carboxylic acid group and a carbon-carbon double bond, a second monomer including a carbon-carbon double bond and a hydrophobic moiety and not including a carboxylic acid group, and optionally a third monomer including a carbon-carbon double bond and a hydrophilic moiety and not including a carboxylic acid group;

a copolymer of the monomer combination;

a multiple aromatic ring-containing polymer having a backbone structure in which two aromatic rings are bound to a quaternary carbon atom that is a constituent atom of another cyclic moiety in the main chain and including a carboxylic acid group (—COOH); or a combination thereof.

The carboxylic acid group-containing compound may have an acid value of greater than or equal to about 50 milligrams of potassium hydroxide per gram (mg KOH/g). The carboxylic acid group-containing compound may have a molecular weight of greater than or equal to about 400 g/mol.

In a quantum dot composition, or a quantum dot composite, an amount of the dispersing agent (e.g., the linear polymer) may be greater than or equal to about 0.5 wt %, for example, greater than or equal to about 1 wt %, greater than or equal to about 5 wt %, greater than or equal to about 10 wt %, greater than or equal to about 15 wt %, or greater than or equal to about 20 wt %, based on a total weight (or a total solid content) of the composition or the composite. In an embodiment, an amount of the dispersing agent (e.g., the linear polymer or the carboxylic acid group-containing binder) may less than or equal to about 50 wt %, less than or equal to about 40 wt %, less than or equal to about 35 wt %, less than or equal to about 33 wt %, or less than or equal to about 30 wt %, based on a total weight (or a total solid content) of the composition or the composite. The amount of the dispersing agent (e.g., the binder polymer) may be greater than or equal to about 0.5 wt % and less than or equal to about 55 wt %, based on a total weight (or a total solid content) of the composition or the composite.

The composition may further include a liquid vehicle (e.g., an organic solvent) (hereinafter, simply referred to as "solvent"). Types of the solvent are not particularly limited. Non-limiting examples of the solvent and the liquid vehicle may include, but are not limited to: ethyl 3-ethoxy propionate; an ethylene glycol series such as ethylene glycol, diethylene glycol, or polyethylene glycol; a glycol ether such as ethylene glycol monomethyl ether, ethylene glycol monoethyl ether, diethylene glycol monomethyl ether, ethylene glycol diethyl ether, or diethylene glycol dimethyl ether; glycol ether acetates such as ethylene glycol monomethyl ether acetate, ethylene glycol monoethyl ether acetate, diethylene glycol monoethyl ether acetate, or diethylene glycol monobutyl ether acetate; a propylene glycol series such as propylene glycol; a propylene glycol ether such as propylene glycol monomethyl ether, propylene glycol monoethyl ether, propylene glycol monopropyl ether, propylene glycol monobutyl ether, propylene glycol dimethyl ether, dipropylene glycol dimethyl ether, propylene glycol diethyl ether, or dipropylene glycol diethyl ether; a propylene glycol ether acetate such as propylene glycol monomethyl ether acetate or dipropylene glycol monoethylether acetate; an amide such as N-methylpyrrolidone, dimethyl formamide, or dimethyl acetamide; a ketone such as methyl ethyl ketone (MEK), methyl isobutyl ketone (MIBK), or cyclohexanone; a petroleum product such as toluene, xylene, or solvent naphtha; an ester such as ethyl acetate, propyl acetate, butyl acetate, cyclohexyl acetate, or ethyl lactate; an ether such as diethyl ether, dipropyl ether, or dibutyl ether; chloroform, a C1 to C40 aliphatic hydrocarbon (e.g., alkane, alkene, or alkyne), a halogen (e.g., chloro) substituted C1 to C40 aliphatic hydrocarbon (e.g., dichloroethane, trichloromethane, or the like), a C6 to C40 aromatic hydrocarbon (e.g., toluene, xylene, or the like), a halogen (e.g., chloro) substituted C6 to C40 aromatic hydrocarbon, or a combination thereof.

Types and amounts of the solvent may be appropriately selected by considering the aforementioned main components (i.e., the quantum dot, the dispersing agent, the photopolymerizable monomer, the photoinitiator, and if used, the thiol compound), and types and amounts of additives which will be described below. The composition may include a solvent in a residual amount except for a desired amount of the solid content (non-volatile components).

The components (a dispersing agent, a monomer, a liquid vehicle, additive, thiol compound, cardo binder, etc.) included in the composition (e.g., a photoresist composition) or the composite of an embodiment may be appropriately selected, for details described in, for example, US-2017-0052444-A1, which is incorporated herein by reference, may be referred.

The composition (e.g., an ink jet composition) may have a viscosity at 25° C. of greater than or equal to about 4 centiPoise (cPs), greater than or equal to about 5 cPs, greater than or equal to about 5.5 cPs, greater than or equal to about 6.0 cPs, or greater than or equal to about 7.0 cPs. The composition (e.g., an ink jet composition) may have a viscosity at 25° C. of less than or equal to about 12 cPs, less than or equal to about 10 cPs, or less than or equal to about 9 cPs.

If the composition is applied in an ink jet process, the composition may be discharged onto a substrate at room temperature and may form a quantum dot polymer composite or a pattern of quantum dot polymer composite, for example, by heating. Together with the disclosed viscosity, the ink composition may have a surface tension at 23° C. of greater than or equal to about 21 milliNewtons per meter (mN/m), greater than or equal to about 22 mN/m, greater than or equal to about 23 mN/m, greater than or equal to about 24 mN/m, greater than or equal to about 25 mN/m, greater than or equal to about 26 mN/m, greater than or equal to about 27 mN/m, greater than or equal to about 28 mN/m, greater than or equal to about 29 mN/m, greater than or equal to about 30 mN/m, or greater than or equal to about 31 mN/m and less than or equal to about 40 mN/m, less than or equal to about 39 mN/m, less than or equal to about 38 mN/m, less than or equal to about 37 mN/m, less than or equal to about 36 mN/m, less than or equal to about 35 mN/m, less than or equal to about 34 mN/m, less than or equal to about 33 mN/m, or less than or equal to about 32 mN/m. A surface tension of the ink composition may be less than or equal to about 31 mN/m, less than or equal to about 30 mN/m, less than or equal to about 29 mN/m, or less than or equal to about 28 mN/m.

If desired, the composition or the composite may further include various additives such as a light diffusing agent, a leveling agent, or a coupling agent in addition to the aforementioned components.

The composition may form the composite including the matrix in a solid state via a polymerization. The composition may further include a (photo) initiator for (photo)polymerization of the aforementioned monomer. The initiator is a compound accelerating a radical reaction (e.g., radical polymerization of monomer) by producing radical chemical species under a mild condition (e.g., by heat or light). The initiator may be a thermal initiator or a photoinitiator. The initiator is not particularly limited and may be appropriately selected.

In the composition, an amount of the initiator may be appropriately adjusted taking into consideration types and amounts of the polymerizable monomers. In an embodiment, the amount of the initiator may be greater than or equal to about 0.01 wt %, for example, greater than or equal to about 1 wt % and less than or equal to about 10 wt %, for example, less than or equal to about 9 wt %, less than or equal to about 8 wt %, less than or equal to about 7 wt %, less than or equal to about 6 wt %, or less than or equal to about 5 wt %, based on a total weight (or a total weight of the solid content) of the composition, but is not limited thereto.

The composition or the composite may further include a metal oxide fine particle (for example, dispersed in the matrix). The metal oxide fine particle may include $TiO_2$, $SiO_2$, $BaTiO_3$, $Ba_2TiO_4$, ZnO, or a combination thereof. In the composition, an amount of the metal oxide fine particle may be greater than or equal to about 1 wt %, greater than or equal to about 5 wt %, or greater than or equal to about 10 wt % and less than or equal to about 50 wt %, less than or equal to about 40 wt %, less than or equal to about 30 wt %, less than or equal to about 25 wt %, less than or equal to about 20 wt %, less than or equal to about 15 wt %, less than or equal to about 10 wt %, or less than or equal to about 5 wt %, based on a total weight (or a solid content thereof) of the composition. The metal oxide fine particle may be non-emissive. The metal oxide fine particle may have an appropriately selected diameter without a particular limit. The diameter of the metal oxide fine particle may be greater than or equal to about 100 nm, for example, greater than or equal to about 150 nm, or greater than or equal to about 200 nm and less than or equal to about 1000 nm or less than or equal to about 800 nm.

The composition according to an embodiment may be prepared by a method including preparing quantum dot dispersion including the aforementioned quantum dots, dispersing agent, and solvent; and mixing the quantum dot dispersion with the initiator, the polymerizable monomer (e.g., acryl-based monomer), optionally, the thiol compound, optionally, the metal oxide particulates, and optionally, the aforementioned additive. Each of the aforementioned components may be mixed sequentially or simultaneously, but mixing orders are not particularly limited. The (ink or photoresist) composition may provide a quantum dot composite or a quantum dot pattern via (radical) polymerization and/or a removal of the solvent.

The film of the quantum dot-polymer composite or the quantum dot-polymer composite pattern that will be described below may have for example a thickness, less than or equal to about 30 micrometers (μm), for example less than or equal to about 25 μm, less than or equal to about 20 μm, less than or equal to about 15 μm, less than or equal to about 10 μm, less than or equal to about 8 μm, less than or equal to about 7 μm and greater than about 2 μm, for example, greater than or equal to about 3 μm, greater than or equal to about 3.5 μm, greater than or equal to about 4 μm, greater than or equal to about 5 μm, or greater than or equal to about 6 μm.

In an embodiment, a patterned film includes a repeating section including a first section emitting first light, wherein the first section includes the quantum dot composite. The repeating patterned film may include a second section emitting second light having a different maximum peak wavelength from that of the first light. The second section may include a quantum dot polymer composite. The quantum dot polymer composite of the second section may include a second quantum dot configured to emit the second light. The second quantum dot may include the aforementioned quantum dot. The first light or the second light may be red light having a maximum photoluminescence peak wavelength, which in a range of about 600 nm to about 650 nm (e.g., about 620 nm to about 650 nm), or green light having a maximum photoluminescence peak wavelength which is in a range of about 500 nm and about 550 nm (e.g., about 510 nm to about 540 nm). The patterned film may further include a third section emitting, or passing third light (e.g., blue light) different from the first light and the second light. The third light may have a maximum peak wavelength in a range of about 380 nm to about 480 nm.

In an embodiment, a display device includes a luminescent element (e.g., a photoluminescent element), and optionally a light source. The luminescent element includes a light emitting layer, and the light emitting layer includes a film or a patterned film of the quantum dot composite. The light emitting layer may be disposed on a (e.g., transparent) substrate. The light source is configured to provide the luminescent element with incident light. The incident light may have a luminescence peak wavelength of greater than or equal to about 440 nm, for example, greater than or equal to about 450 nm and less than or equal to about 500 nm, for example, less than or equal to about 480 nm, less than or equal to about 470 nm, or less than or equal to about 460 nm.

In an embodiment, the light emitting element, or the light emission layer, may include a sheet of the quantum dot polymer composite. Referring to FIG. 1, a device 400 of a photoluminescent type may include a backlight unit (for example, including a blue light source) and a liquid crystal panel (LC), and the backlight unit may include the sheet of the quantum dot polymer composite (QD sheet). The backlight unit may have a structure wherein a blue light source, the quantum dot-polymer composite sheet (QD sheet), and various optical films such as a prism, dual brightness enhancement film (DBEF), and the like are stacked, and a liquid crystal panel is disposed on the backlight unit. The backlight unit may further include a reflector, a light guide panel, or a combination thereof. A thin film transistor (TFT), a liquid crystal (LC), and a color filter may be disposed between two polarizers (Pol). The quantum dot polymer composite (QD sheet) may include red quantum dots and green quantum dots that absorbs light from the light source and emits red and green light, respectively. Blue light provided from the light source may pass through the quantum dot polymer composite sheet, and if combined with the red and green lights emitted from the quantum dots, the blue light is converted into white light. The white light may be separated into a blue light, a green light, and a red light by a color filter in the liquid crystal panel and extracted outside according to the pixel.

In the light emitting layer (e.g., patterned film of quantum dot polymer composite) of the display device according to an embodiment, the first section may be a section emitting red light, and the second section may be a section emitting green light, and the light source may be an element emitting blue light, or optionally, green light. In an embodiment, on a front side (i.e., light emitting face) of the first section and the second section may be disposed a first optical element cutting (e.g., absorbing or reflecting) blue light and optionally green light. In an embodiment, the light source may include a blue light emitting OLED and a green light emitting OLED and on a third section passing the blue light, a green light cutting element may be disposed.

In the aforementioned display device, the light source may include a plurality of light emitting units respectively corresponding to the first section and the second section, and the light emitting units may include a first electrode and a second electrode each having a surface opposite the other and an electroluminescence layer disposed between the first electrode and the second electrode. The electroluminescence layer may include an organic light emitting material. For example, each light emitting unit of the light source may include an electroluminescent device (e.g., an organic light emitting diode (OLED)) configured to emit light of a predetermined wavelength (e.g., blue light, green light, or a combination thereof). Structures and materials of the electroluminescent device and the organic light emitting diode (OLED) are not particularly limited. The light source includes an organic light emitting diode (OLED) emitting blue light (and optionally, green light).

Figure 2A:
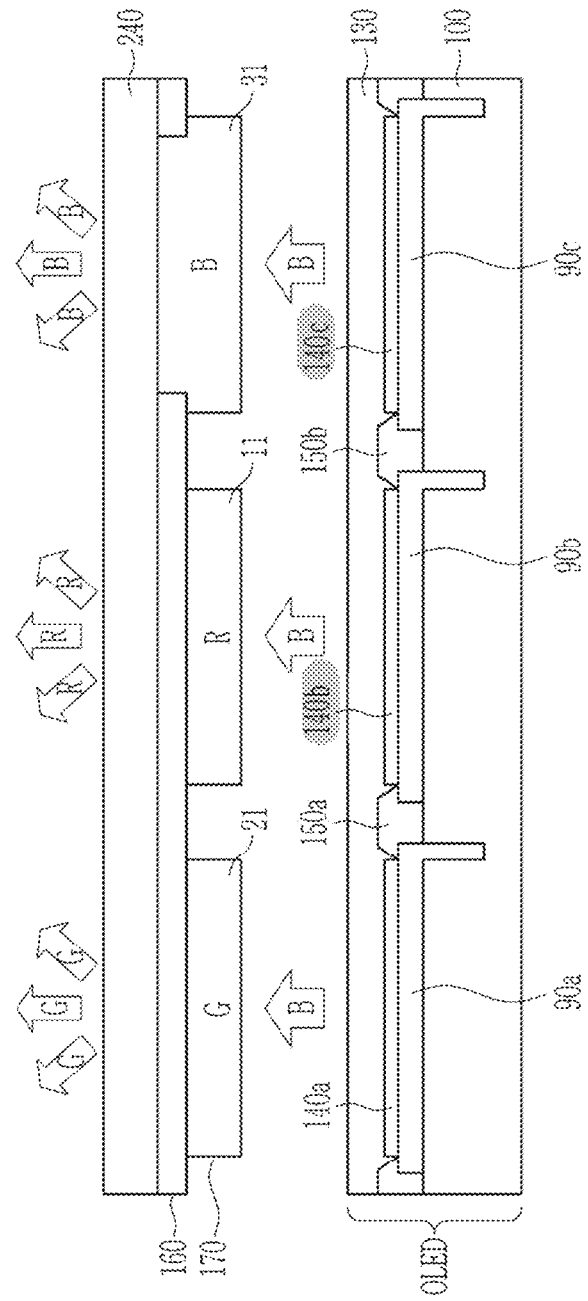
FIG. 2A is a cross-sectional view of a display device according to an embodiment.
Figure 2B:
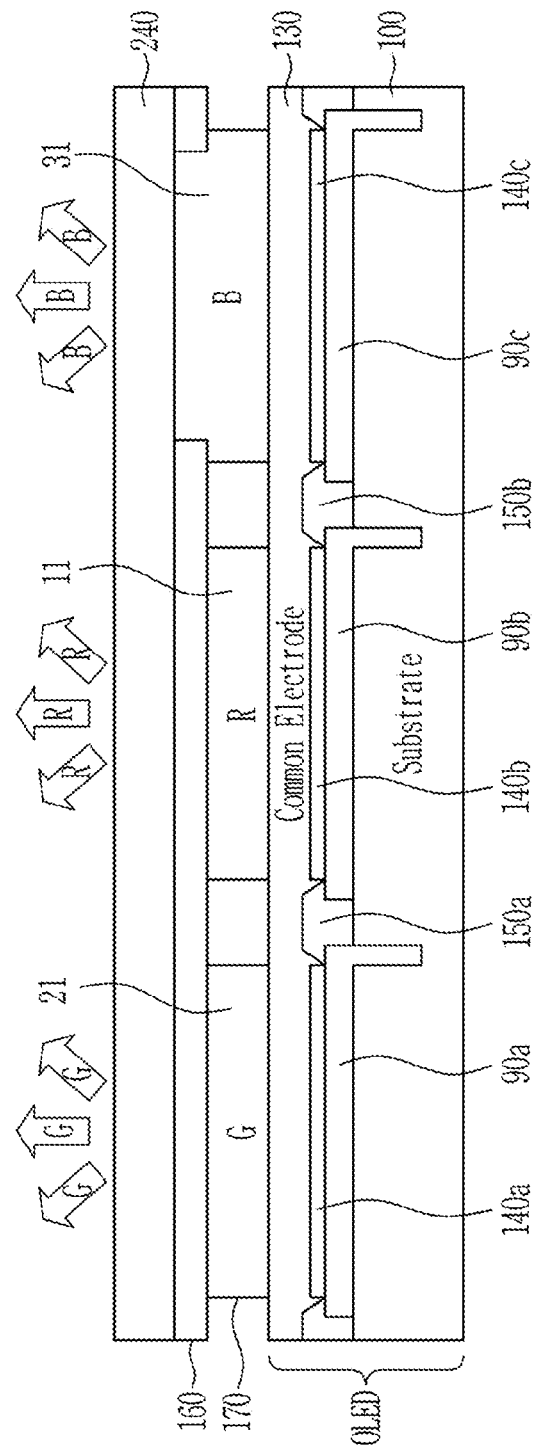
FIG. 2B is a cross-sectional view of a display device according to an embodiment.

FIG. 2A is a schematic cross-sectional view of a display device according to an embodiment, and FIG. 2B is a schematic cross-sectional view of a display device according to an embodiment. Referring to FIGS. 2A and 2B, a light source includes an organic light emitting diode (OLED) emitting blue light. The organic light emitting diode OLED may include (at least two, for example, three or more) pixel electrodes 90a, 90b, 90c formed on a substrate 100, a pixel defining layer 150a, 150b formed between the adjacent pixel electrodes 90a, 90b, 90c, an organic light emitting layer 140a, 140b, 140c formed on the pixel electrodes 90a, 90b, 90c, and a common electrode (layer) 130 formed on the organic light emitting layer 140a, 140b, 140c. A thin film transistor and a substrate may be disposed under the organic light emitting diode (OLED).

A stacked structure including a quantum dot composite pattern 170 (e.g., a section 31 including or not including a quantum dot e.g., emitting blue light, a section 11 including red light emitting quantum dots, and a section 21 including green light emitting quantum dots), optical filter layer 160, and a transparent substrate (or referred to as an upper substrate) 240 may be disposed on the light source. The light (e.g., blue light) emitted from the light source may enter the first section 11 and the second section 21 of the pattern 170 to emit (e.g., converted) red light R and green light G, respectively. The blue light B emitted from the light source passes through or transmits from the third section 31.

Between the quantum dot composite layer (R, G) and the substrate, an optical filter layer (optical element) 160 (a first optical filter or an excitation light cut layer) cutting the light from the light source may be disposed. In an embodiment, the light from the light source may include blue light or green light, a green light cut filter may be disposed over the third section. Details of the first optical filter or the excitation light cut filter may be further described in detail herein.

The display device may be obtained by separately fabricating the stack structure and (e.g., blue light emitting) LED or OLED and then assembling the same. Alternatively, the display device may be obtained by forming a quantum dot polymer composite pattern directly on the LED or OLED.

The substrate may be a substrate including an insulating material. The substrate may include glass; various polymers such as a polyester (e.g., polyethylene terephthalate (PET), polyethylene naphthalate (PEN), a polymethacrylate, or a polyacrylate); a polycarbonate; a polysiloxane (e.g., polydimethylsiloxane (PDMS)); an inorganic material such as $Al_2O_3$ or ZnO; or a combination thereof, but is not limited thereto. A thickness of the substrate may be selected appropriately considering a substrate material but is not particularly limited. The substrate may have flexibility. The substrate may have a transmittance of greater than or equal to about 50%, greater than or equal to about 60%, greater than or equal to about 70%, greater than or equal to about 80%, or greater than or equal to about 90% for light emitted from the quantum dot.

A wire layer including a thin film transistor or the like is formed on the substrate. The wire layer may further include a gate line, a sustain voltage line, a gate insulating layer, a data line, a source electrode, a drain electrode, a semiconductor, a protective layer, and the like. The detail structure of the wire layer may be verified according to an embodiment. The gate line and the sustain voltage line are electrically separated from each other, and the data line is insulated and crossing the gate line and the sustain voltage line. The gate electrode, the source electrode, and the drain electrode form a control terminal, an input terminal, and an output terminal of the thin film transistor, respectively. The drain electrode is electrically connected to the pixel electrode that will be described below.

The pixel electrode may function as an anode of the display device. The pixel electrode may be formed of a transparent conductive material such as indium tin oxide (ITO) or indium zinc oxide (IZO). The pixel electrode may be formed of a material having a light-blocking property such as gold (Au), platinum (Pt), nickel (Ni), tungsten (W), chromium (Cr), molybdenum (Mo), iron (Fe), cobalt (Co), copper (Cu), palladium (Pd), or titanium (Ti). The pixel electrode may have a two-layered structure where the transparent conductive material and the material having light-blocking properties are stacked sequentially.

Between two adjacent pixel electrodes, a pixel define layer (PDL) is overlapped with a terminal end of the pixel electrode to divide the pixel electrode into a pixel unit. The pixel define layer is an insulation layer which may electrically block the at least two pixel electrodes.

The pixel define layer covers a part of the upper surface of the pixel electrode, and the remaining region of the pixel electrode where is not covered by the pixel define layer may provide an opening. An organic emission layer that will be described below may be formed in the region defined by the opening.

The organic emission layer defines each pixel area by the pixel electrode and the pixel define layer. In other words, one pixel area may be defined as an area where is formed with one organic emission unit layer which is contacted with one pixel electrode divided by the pixel define layer.

For example, in the display device according to an embodiment, the organic emission layer may be defined as a first pixel area, a second pixel area and a third pixel area, and each pixel area is spaced apart from each other leaving a predetermined interval by the pixel define layer.

In an embodiment, the organic emission layer may emit a third light in a visible light region or a UV region. That is, each of the first to the third pixel areas of the organic emission layer may emit a third light. In an embodiment, the third light may be a light having the highest energy in the visible light region, for example, may be blue light. The third light may further include green light. When all pixel areas of the organic emission layer are designed to emit the same light, each pixel area of the organic emission layer may be all formed of the same or similar materials or may show the same or similar properties. Thus, it may significantly reduce a difficulty in a manufacturing process for forming the organic emission layer. As a result, the display device may be easily applied to a large scale/large area process. However, the organic emission layer according to an embodiment is not necessarily limited thereto, but the organic emission layer may be designed to emit at least two different lights.

The organic emission layer includes an organic emission unit layer in each pixel area, and each organic emission unit layer may further include an auxiliary layer (e.g., hole injection layer (HIL), hole transport layer (HTL), electron transport layer (ETL), etc.) besides the emission layer.

The common electrode may function as a cathode of the display device. The common electrode may be formed of a transparent conductive material such as indium tin oxide (ITO) or indium zinc oxide (IZO). The common electrode may be formed on the organic emission layer and may be integrated therewith.

A planarization layer or a passivation layer may be formed on the common electrode. The planarization layer may include a (e.g., transparent) insulating material for ensuring electrical insulation with the common electrode.

In an embodiment, the display device may further include a lower substrate, a polarizer disposed under the lower substrate, and a liquid crystal layer disposed between the stack structure and the lower substrate, and in the stack structure, the light emission layer may be disposed to face the liquid crystal layer. The display device may further include a polarizer between the liquid crystal layer and the emission layer. The light source may further include LED and if desired, a light guide panel.

Figure 3:
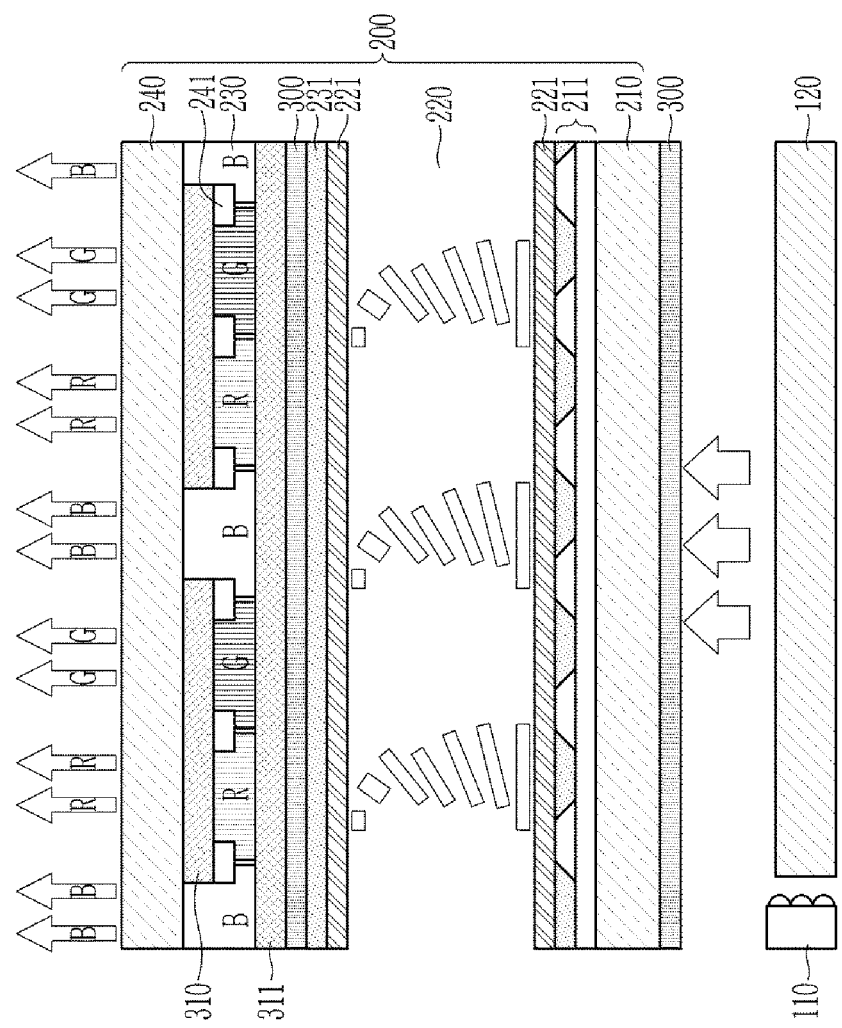
FIG. 3 is a cross-sectional view of a display device according to an embodiment.

Non-limiting examples of the display device (e.g., a liquid crystal display device) according to an embodiment are illustrated with a reference to a drawing. FIG. 3 is a schematic cross sectional view showing a liquid crystal display device according to an embodiment. The display device of an embodiment includes a liquid crystal panel 200, a polarizer 300 disposed under the liquid crystal panel 200, and a backlight unit (110,120) disposed under the polarizer 300.

The liquid crystal panel 200 includes a lower substrate 210, a stack structure, and a liquid crystal layer 220 disposed between the stack structure and the lower substrate. The stack structure includes a transparent substrate 240 and a photoluminescent layer 230 including a pattern including a quantum dot polymer composite.

The lower substrate 210 also referred to be an array substrate may be a transparent insulating material substrate. The substrate is the same as described above. A wire plate 211 is provided on an upper surface of the lower substrate 210. The wire plate 211 may include a plurality of gate wires and data wires that define a pixel area, a thin film transistor disposed adjacent to a crossing region of gate wires and data wires, and a pixel electrode for each pixel area, but is not limited thereto. Details of such a wire plate are known and are not particularly limited.

The liquid crystal layer 220 may be disposed on the wire plate 211. The liquid crystal panel 200 may include an alignment layer 221 on or under the liquid crystal layer 220 to initially align the liquid crystal material included therein. Details (e.g., a liquid crystal material, an alignment layer material, a method of forming liquid crystal layer, a thickness of liquid crystal layer, or the like) of the liquid crystal material and the alignment layer are known and are not particularly limited.

A lower polarizer 300 is provided under the lower substrate 210. Materials and structures of the polarizer 300 are known and are not particularly limited. A backlight unit (e.g., emitting blue light) may be disposed under the polarizer 300.

An upper optical element or an upper polarizer 300 may be provided between the liquid crystal layer 220 and the transparent substrate 240, but is not limited thereto. For example, the upper polarizer 300 may be disposed between the liquid crystal layer 220 and the photoluminescent (e.g., light emission) layer 230. The polarizer may be any polarizer that used in a liquid crystal display device. The polarizer may be TAC (triacetyl cellulose) having a thickness of less than or equal to about 200 μm, but is not limited thereto. In an embodiment, the upper optical element may be a coating that controls a refractive index without a polarization function.

The backlight unit includes a light source 110. The light source may emit blue light or white light. The light source 110 may include a blue LED, a white LED, a white OLED, or a combination thereof, but is not limited thereto.

The backlight unit may further include a light guide panel 120. In an embodiment, the backlight unit may be an edge-type lighting. For example, the backlight unit may include a reflector, a light guide panel provided on the reflector and providing a planar light source with the liquid crystal panel 200, at least one optical sheet on the light guide panel, for example, a diffusion plate, a prism sheet, and the like, or a combination thereof, but is not limited thereto. Alternatively, the backlight unit may not include a light guide panel. In an embodiment, the backlight unit may be a direct lighting. For example, the backlight unit may have a reflector, and may have a plurality of fluorescent lamps disposed on the reflector at regular intervals, or may have an LED operating substrate on which a plurality of light emitting diodes may be disposed, a diffusion plate thereon, and optionally at least one optical sheet. Details (e.g., each component of a light emitting diode, a fluorescent lamp, light guide panel, various optical sheets, and a reflector) of such a backlight unit are known and are not particularly limited.

A black matrix 241 is provided under the transparent substrate 240 and has openings and hides a gate line, a data line, and a thin film transistor of the wire plate on the lower substrate. For example, the black matrix 241 may have a lattice shape. The photoluminescent layer 230 is provided in the openings of the black matrix 241 and has a quantum dot-polymer composite pattern including a first section (R) configured to emit a first light (e.g., red light), a second section (G) configured to emit a second light (e.g., green light), and a third section (B) configured to emit/transmit, for example blue light. If needed, the photoluminescent layer 230 may further include at least one fourth section. The fourth section may include a quantum dot that emits light of a different color from light emitted from the first to third sections (e.g., cyan, magenta, and yellow light).

In the light emission layer 230, sections forming a pattern may be repeated corresponding to pixel areas formed on the lower substrate 210. A transparent common electrode 231 may be provided on the photoluminescent layer 230 (e.g., photoluminescent color filter layer).

The third section (B) configured to emit/transmit blue light may be a transparent color filter that does not change a light emitting spectrum of the light source. In this case, blue light emitted from the backlight unit may enter in a polarized state and may be emitted through the polarizer and the liquid crystal layer as it is. If needed, the third section may include a quantum dot emitting blue light.

If desired, the display device may further include an excitation (e.g., blue light blocking layer (blue light cut filter) or a first optical filter layer. The blue light blocking layer or the first optical filter layer may be disposed between a bottom surface of the first section (R) and the second section (G) and the upper substrate 240, or disposed on a top surface of the upper substrate 240. The blue light blocking layer or first optical filter layer may include a sheet having openings that correspond to a pixel area configured to emit blue light (e.g., third section) and may be formed on portions corresponding to the first and second sections. The first optical filter layer (310) may be integrally formed as one body structure with the red and green section portions or at the portion except portions overlapped with the third section, but is not limited thereto. At least two first optical filter layers may be spaced apart and be disposed on each of the positions overlapped with the first and the second sections. If the light source include a green light emitting element, a green light cut filter may be disposed on the third section.

In an embodiment, the first optical filter layer may block light having a portion of a wavelength region in the visible light region and transmit light having other wavelength regions. For example, the first optical filter layer may block blue light and transmit light except blue light. For example, the first optical filter layer may transmit green light, red light, and/or or yellow light that is mixed light thereof.

In an embodiment, the first optical filter layer may substantially block blue light having a wavelength of less than or equal to about 500 nm and may transmit light in another visible light wavelength region of greater than about 500 nm and less than or equal to about 700 nm.

In an embodiment, the first optical filter layer may have light transmittance of greater than or equal to about 70%, greater than or equal to about 80%, greater than or equal to about 90%, or close to about 100% with respect to visible light of greater than about 500 nm and less than or equal to about 700 nm.

The first optical filter layer may include a polymer thin film including a dye, a pigment, or a combination thereof to absorb light of wavelengths that is to be blocked. The first optical filter layer may block at least 80%, or at least 90%, even at least 95% of blue light having a wavelength of less than or equal to about 480 nm and it may have light transmittance of greater than or equal to about 70%, greater than or equal to about 80%, greater than or equal to about 90%, or close to about 100% with respect to other visible light having a wavelength of greater than about 500 nm and less than or equal to about 700 nm.

The first optical filter layer may block (e.g., by absorbing light of select wavelengths) including the blocking of blue light having a wavelength of less than or equal to about 500 nm, and for example, may selectively transmit green light or red light. In a particular case, at least two first optical filter layers may be spaced apart and disposed on and overlap with the first and second sections, respectively. For example, a first optical filter layer selectively transmitting red light may be disposed on the portion overlapped with the section emitting red light, and the first optical filter layer selectively transmitting green light may be disposed on the portion overlapped with the section emitting green light. For example, the first optical filter layer may include at least one of a first region and a second region wherein the first region blocks (e.g., absorbs) blue light and red light and transmits green light having a wavelength of a predetermined range, e.g., greater than or equal to about 500 nm, greater than or equal to about 510 nm, or greater than or equal to about 515 nm and less than or equal to about 550 nm, less than or equal to about 545 nm, less than or equal to about 540 nm, less than or equal to about 535 nm, less than or equal to about 530 nm, less than or equal to about 525 nm, or less than or equal to about 520 nm), and the second region blocks (e.g., absorbs) blue light and green light and transmits red light having a wavelength of a predetermined range, e.g., greater than or equal to about 600 nm, greater than or equal to about 610 nm, or greater than or equal to about 615 nm and less than or equal to about 650 nm, less than or equal to about 645 nm, less than or equal to about 640 nm, less than or equal to about 635 nm, less than or equal to about 630 nm, less than or equal to about 625 nm, or less than or equal to about 620 nm. The first region may be disposed at a position overlapped with the section emitting green light, and the second region may be disposed at a position overlapped with the section emitting red light. The first region and the second region may be optically isolated. The first optical filter (layer) may contribute to improving color purity of a display device.

The first optical filter layer may be a reflective filter including a plurality of layers (e.g., inorganic material layers) with different refractive index. For example, two layers having different refractive index may be alternately stacked with each other, or for example, a layer having a high refractive index and a layer having a low refractive index may be alternately stacked with each other. As the difference in refractive index between the layer having a high refractive index and the layer having a low refractive index increases, a first optical filter layer having higher wavelength selectivity may be provided. A thickness and the number of the stacked layers having a layer of a high refractive index and a layer of a low refractive index may be determined according to a refractive index of each layer and a reflected wavelength. For example, each layer having a high refractive index may have a thickness of about 3 nm to about 300 nm, and each layer having a low refractive index may have a thickness of about 3 nm to about 300 nm.

A total thickness of the first optical filter layer may be, for example, from about 3 nm (or about 6 nm) to about 10,000 nm, about 300 nm to about 10,000 nm, or about 1,000 nm to about 10,000 nm. The high refractive index layers may have the same thickness, be of the same material, or a combination thereof. Alternatively, the high refractive index layers may have a different thickness, be of a different material, or a combination thereof. The low refractive index layers may have the same thickness, be of the same material, or a combination thereof. Alternatively, the low refractive index layers may have a different thickness, be of a different material, or a combination thereof.

The display device may further include a second optical filter layer 311 (e.g., a red/green or yellow light recycling layer) disposed between the light emission layer and the liquid crystal layer (e.g., between a light emission layer and an upper polarizer) and transmitting at least a part of the third light and reflecting at least a part of the first light and the second light. The second optical filter layer may reflect light in a wavelength region of greater than about 500 nm. The first light may be red light, the second light may be green light, and the third light may be blue light.

In the display device according to an embodiment, the second optical filter layer may be formed as an integrated single layer having an approximately planar surface.

In an embodiment, the second optical filter layer may include a monolayer having a low refractive index. For example, the second optical filter layer may be a transparent thin film having a refractive index of less than or equal to about 1.4, less than or equal to about 1.3, or less than or equal to about 1.2.

The second optical filter layer having a low refractive index may include, for example, a porous silicon oxide, a porous organic material, a porous organic/inorganic composite, or a combination thereof.

In an embodiment, the second optical filter layer may include a plurality of layers having different refractive indexes. For example, the second optical filter layer may be formed by alternatively stacking two layers having different refractive indexes, or for example, it may be formed by alternatively stacking a material having a high refractive index and a material having a relatively lower refractive index.

The layer having a high refractive index in the second optical filter layer may include, for example, at least one of hafnium oxide, tantalum oxide, titanium oxide, zirconium oxide, magnesium oxide, cesium oxide, lanthanum oxide, indium oxide, niobium oxide, aluminum oxide, and silicon nitride, but according to embodiments, it may include a variety of materials having a higher refractive index than the layer having a low refractive index.

The layer having a low refractive index in the second optical filter layer may include, for example, a silicon oxide, but according to embodiments, it may include a variety of materials having a lower refractive index than the layer having a high refractive index.

As the difference in the refractive index between the layer having a high refractive index and the layer having a low refractive index increases, the second optical filter layer may have a higher wavelength selectivity.

In the second optical filter layer, each thickness of the layer having a high refractive index, and the layer having a low refractive index, or the stacked number thereof, may be determined depending upon a refractive index of each layer and the reflected wavelength. For example, each layer having a high refractive index in the second optical filter layer may have a thickness of about 3 nm to about 300 nm, and each layer having a low refractive index in the second optical filter layer may have a thickness of about 3 nm to about 300 nm. A total thickness of the second optical filter layer may be, for example, from about 3 nm (or about 6 nm) to about 10,000 nm, about 300 nm to about 10,000 nm, or about 1,000 nm to about 10,000 nm. Each of the layer having a high refractive index and the layer having a low refractive index in the second optical filter layer may have the same thickness and materials or different thickness and materials from each other.

The second optical filter layer may reflect at least a portion of the first light (R) or the second light (G), and transmit at least a portion (or the entire) of the third light (B). For example, the second optical filter layer may transmit only the third light (B) in a blue light wavelength region of less than or equal to about 500 nm and light in a wavelength region of greater than about 500 nm, that is, green light (G), yellow light, red light (R), and the like may be not passed through the second optical filter layer. As a result, the reflected green light and red light may pass through the first and the second sections to be emitted to the outside of the display device 10.

The second optical filter layer may reflect a wavelength region of greater than about 500 nm in greater than or equal to about 70%, greater than or equal to about 80%, or greater than or equal to about 90%, or even about 100%.

Meanwhile, the second optical filter layer may have a transmittance to a wavelength region of less than or equal to about 500 nm of, for example, greater than or equal to about 90%, greater than or equal to about 92%, greater than or equal to about 94%, greater than or equal to about 96%, greater than or equal to about 98%, greater than or equal to about 99%, or even about 100%.

In an embodiment, the stack structure may be produced by a method using the photoresist composition. The method may include:

forming a film of the composition on a substrate;

exposing a selected region of the film to light (e.g., a wavelength of less than or equal to about 400 nm); and developing the exposed film with an alkali developing solution to obtain a pattern including the quantum dot-polymer composite.

Figure 4A:
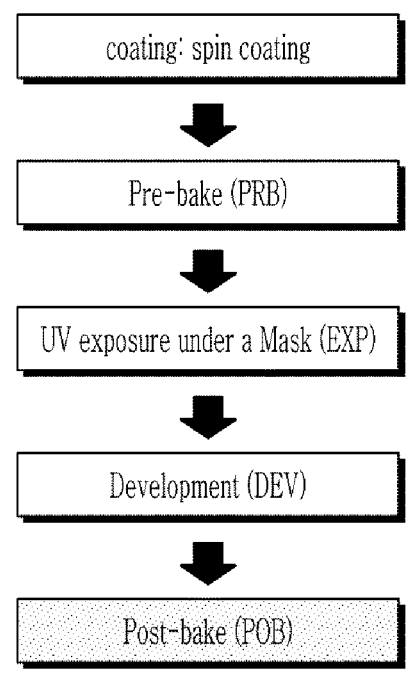
FIG. 4A shows a process of producing a quantum dot composite pattern using a composition according to an embodiment.
Figure 4A:
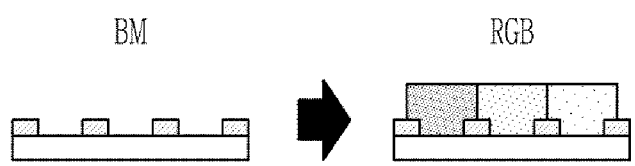

The substrate and the composition are the same as described herein. Non-limiting methods of forming the pattern are illustrated, referring to FIG. 4A.

The composition is coated to have a predetermined thickness on a substrate in an appropriate method of spin coating, slit coating, and the like (Step 1). The formed film may be, optionally, pre-baked (PRB) (Step 2). The pre-baking may be performed by selecting appropriate conditions of temperature, time, atmosphere, and the like.

The formed (or optionally pre-baked) film is exposed to light having a predetermined wavelength under a mask having a predetermined pattern (Step 3). A wavelength and intensity of the light may be selected by taking into consideration the initiator (e.g., photoinitiator), an amount of the initiator (e.g., photoinitiator), the quantum dots, amounts of the quantum dots, and the like.

The exposed film is treated with an alkali developing solution (e.g., dipping or spraying) to dissolve an unexposed region and obtain a desired pattern (Step 4). The obtained pattern may be, optionally, post-baked (POB) to improve crack resistance and solvent resistance of the pattern, for example, at about 150° C. to about 230° C. for a predetermined time (e.g., greater than or equal to about 10 minutes or greater than or equal to about 20 minutes) (Step 5).

In an embodiment in which the quantum dot-polymer composite pattern has a plurality of repeating sections, a quantum dot-polymer composite having a desired pattern may be obtained by preparing a plurality of compositions including a plurality of quantum dot as described herein, and having desired photoluminescence properties (a photoluminescence peak wavelength and the like) to form each repeating section (e.g., a red light emitting quantum dot, a green light emitting quantum dot, or optionally, a blue light emitting quantum dot). The black matrix sections (e.g., sub-pixels) BM may be repeated any appropriate number of times (e.g., two or more times or three or more times) to provide a pattern about each composition (Step 6). For example, the quantum dot-polymer composite may have, e.g., be provided in, a pattern including at least two repeating color sections (e.g., RGB sections). The quantum dot composite pattern may be used as a photoluminescence-type color filter in a display device.

Figure 4B:
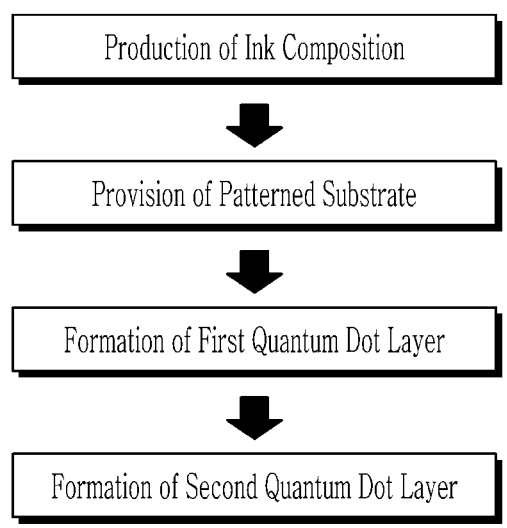
FIG. 4B shows a process of producing a quantum dot composite pattern using a composition according to an embodiment.

A quantum dot composite pattern may be formed by using an ink composition configured to form a pattern via an ink jet manner. Referring to FIG. 4B, the method includes preparing an ink composition; obtaining a substrate including a pattern of, for example, an electrode and optionally an pixel area formed by a bank; depositing an ink composition on the substrate (or the pixel area) to form a first quantum dot layer (or a first repeating section); and depositing an ink composition on the substrate (or the pixel area) to form a second quantum dot layer (or a second repeating section). Formation of the first quantum dot layer and the second quantum dot layer may be carried out simultaneously or sequentially. Deposition of the ink composition may be carried out using an appropriate droplet discharging system such as an ink jet printer or a nozzle printing system (e.g., having an ink reservoir and a, e.g., at least one, printer head).

The deposited ink composition may be heated to remove a solvent and optionally to carry out a polymerization, and thus, provide a (first or second) quantum dot layer. The method may provide a highly precise quantum dot-polymer composite film or pattern in a simple way for a short time.

An embodiment provides an electronic device including the quantum dot. The electronic device may include a light emitting diode (LED), an organic light emitting diode (OLED), a sensor, a solar cell, an imaging sensor, or a liquid crystal display (LCD), but is not limited thereto.

The quantum dots of the embodiment may be included in an electronic apparatus. The electronic apparatus may include a handheld terminal, a monitor, a notebook computer, a television, an electronic display board, a camera, an automatic vehicle, but is not limited thereto. The electronic apparatus may be a handheld terminal, a monitor, a notebook computer, or a television each of which includes a display device (or a light emitting device) including a quantum dot. The electronic apparatus may be a camera or a handheld terminal each of which includes an image sensor including a quantum dot. The electronic apparatus may be a camera or an automatic vehicle each of which includes a photodetector including the core shell quantum dots.

Hereinafter, the embodiments are illustrated in more detail with reference to examples. However, they are exemplary embodiments of the present invention, and the present invention is not limited thereto.

EXAMPLES

Analysis Methods

1. Ultraviolet (UV)-Visible (Vis) Absorption Analysis

An Agilent Cary5000 spectrometer is used to obtain and perform UV-Visible absorption spectrum and analysis.

2. Photoluminescence Analysis

Photoluminescence spectrum and analysis is performed using a Hitachi F-7000 spectrometer.

3. Quantum Yield Measurement

A quantum yield is measured by using QE-2100 (from Otsuka electronics Co. Ltd.) for a quantum dot dispersion or a quantum dot polymer composite. The quantum yield as measured is a value obtained by dividing the number of photons emitted from the light emission from the quantum dot dispersion or the quantum dot polymer composite with the number of photons absorbed by the dispersion or composite, respectively.

4. Operation Reliability Test

An operation reliability is evaluated using 1500 nit backlight unit as a light source (wavelength: 450 nm) in air at a temperature of 60° C.

5. ICP Analysis

An inductively coupled plasma-atomic emission spectroscopy (ICP-AES) analysis is performed using Shimadzu ICPS-8100.

6. Arithmetic Size with Density Functional Theory

The experimental methods described in Jang et al., Nanotechnology 2013, 24, 215201 (5 pages) (for example, FIG. 2(b) and a related description) is used to determine a core diameter.

7. Centrifugation

Centrifugation is carried out by using Eppendorf Centrifuge 5810 R.

Preparation Example 1 (Sample B)

[1] Preparation of Semiconductor Nanocrystal Core

Indium acetate and palmitic acid are dissolved in 1-octadecene in a 200 milliliters (mL) reaction flask, and the solution is subjected to a vacuum state at 120° C. for one hour. A molar ratio of indium to palmitic acid is 1:3 is used. The atmosphere in the flask is exchanged with $N_2$, and the flask is heated to 280° C. A mixed solution of tris(trimethylsilyl)phosphine ($TMS_3P$) and trioctylphosphine (TOP) is quickly injected, and the reaction proceeds for a predetermined time (e.g., for about 20 minutes). The reaction mixture is rapidly cooled to room temperature, and acetone is added to facilitate the precipitation of nanocrystals, which are then separated by centrifugation and dispersed in toluene to obtain a toluene dispersion of the InP core nanocrystals. The amount of the $TMS_3P$ added to the reaction flask is about 0.5 moles per one mole of indium. The amount of the trioctylphosphine added to the reaction flask is about 0.1 moles to about 10 moles (e.g., about 0.5 moles) per one mole of indium. An average particle size of the InP core is about 3.6 nanometers (nm) to 3.8 nm.

[2] Shell Coating

Selenium and sulfur are dispersed in trioctylphosphine (TOP) to obtain a Se/TOP stock solution and a S/TOP stock solution, respectively.

In a 200 mL reaction flask, zinc acetate and oleic acid are dissolved in trioctyl amine and the solution is subjected to vacuum at 120° C. for 10 minutes. The atmosphere in the reaction flask is then exchanged with $N_2$. The solution is heated to about 320° C., and a toluene dispersion of the InP semiconductor nanocrystal core prepared above is injected into the reaction flask followed by the injection of a Se/TOP stock solution, and optionally, zinc acetate, into the reaction flask. A reaction is carried out to obtain a reaction solution including a particle having a ZnSe shell disposed on the core. A total of reaction time is 100 minutes.

A S/TOP stock solution and zinc acetate are injected to the reaction mixture at about 320° C. A reaction is carried out to obtain a resulting solution including a particle having a ZnS shell disposed on the ZnSe shell. A total of reaction time is 40 minutes.

An excess amount of ethanol is added to the final reaction mixture including the resulting InP/ZnSe/ZnS semiconductor nanocrystals, and the mixture is centrifuged. After centrifugation, the supernatant is discarded and the precipitate is dried and dispersed in chloroform to obtain a quantum dot solution (hereinafter, QD solution).

Total amounts of Se, S, and Zn per one mole of indium are controlled so that a population of the quantum dots separated from the crude solution show mole ratios of components (zinc, selenium, sulfur, and indium) as shown in Table 2. From the core size and the measured composition, the population of the quantum dots as obtained have an arithmetic size of 8.85 nm, and a thickness of ZnSe and a thickness of ZnS are 2.05 nm and 0.48 nm, respectively.

A photoluminescent analysis and an ICP-AES analysis of the prepared quantum dots are performed and the results are listed in Table 1.

[3] Reprecipitation of Quantum Dots

The obtained population of the quantum dots are subject to a process of reprecipitation using a reprecipitation solvent 1 (a mixture of toluene and ethanol at a ratio of 1:1.4) (i.e., adding reprecipitation solvent 1 to the QD solution at a volume ratio of the QD solution:toluene:ethanol=1:1:1.4) and conducting centrifugation from a resulting mixture) and a first quantum dot population are separated out from the mixture with solvent 1. A photoluminescent analysis and an ICP-AES analysis of the first quantum dot population is performed and the results are listed in Table 1A and Table 2.

After the separation of the first quantum dots from the mixture with solvent 1, the remaining solution is subjected to additional reprecipitation using a precipitation solvent 2 (mixture of toluene and ethanol at a ratio of 1:1.6), precipitation solvent 3 (mixture of toluene and ethanol at a ratio of 1:1.8), precipitation solvent 4 (mixture of toluene and ethanol at a ratio of 1:2.0), and precipitation solvent 5 (mixture of toluene and ethanol at a ratio of 1:2.2), to obtain #2 to #5 populations of quantum dots, respectively and a fraction (wt %) of each population is measured.

For each of the #1 to #5 populations quantum dots obtained, a photoluminescent analysis and an ICP-AES analysis are performed and the results are listed in Table 1A.

Preparation Example 2 (Sample C)

A population of quantum dots is prepared in the same manner as Preparation Example 1 except that total amounts of Se, S, and Zn per one mole of indium are controlled so that a population of the quantum dots separated from the crude solution have mole ratios of components (zinc, selenium, sulfur, and indium) as listed in Table 2. From the core size and the quantum dot composition, the population of the quantum dots obtained have an arithmetic size of 9.19 nm, and a thickness of ZnSe and a thickness of ZnS are 2.38 nm and 0.32 nm, respectively.

For the obtained population of the quantum dots of Preparation Example 2, a photoluminescent analysis and an ICP-AES analysis are performed and the results are listed in Table 1B and Table 2.

As in the same manner as Preparation Example 1, the prepared and separated crude population of quantum dots is then subject to a process of multiple reprecipitation sequences using the same precipitation solvents as in Preparation Example 1 to obtain #1 to #5 populations of quantum dots of Preparation Example 2 and a fraction (wt %) of each population is measured.

For each of the #1 to #5 populations of quantum dots obtained, a photoluminescent analysis and an ICP-AES analysis is performed and the results are listed in Table 1B.

Comparative Preparation Example 1 (Sample A)

A population of quantum dots is prepared in the same manner as Preparation Example 1 except that total amounts of Se, S, and Zn per one mole of indium are controlled so that a population of quantum dots separated from the crude solution have mole ratios of components (zinc, selenium, sulfur, and indium) as listed in Table 2. From the core size and the quantum dot composition, the population of the quantum dots obtained have an arithmetic size of about 7.89 nm, and a thickness of ZnSe and a thickness of ZnS are 1.56 nm and 0.49 nm, respectively.

For the obtained population of the quantum dots of Comparative Example 1, a photoluminescent analysis and an ICP-AES analysis are performed and the results are listed in Table 1A and Table 2.

As in the same manner as Preparation Example 1, the prepared and separated population of quantum dots of Comparative Example 1 is subject to multiple reprecipitation sequences using the same precipitation solvents as in Preparation Example 1 to obtain first, second, third, fourth, and fifth quantum dot populations of Comparative Example 1 and a fraction (wt %) of each population is measured.

For each of the first, second, the third, the fourth, and the fifth quantum dot populations obtained, a photoluminescent analysis and an ICP-AES analysis is performed and the results are listed in Table 1A.

TABLE 1A

|  | Comp. Prep. Example 1 | | | Prep. Example 1 | | |
|---|---|---|---|---|---|---|
|  | PL(nm) | | arithmetic size, nm (fraction %), ZnSe thickness, nm | PL (nm) | | arithmetic size, nm (fraction %), ZnSe thickness, nm |
| sample | wavelength | FWHM |  | wavelength | FWHM |  |
| crude | 635 | 41 | 7.89 (100%) ZnSe: 1.56 | 633 | 40 | 8.85 (100%) ZnSe: 2.05 |
| #1 | 633 | 36 | 8.4 (60%) ZnSe: 1.8 | 633 | 39 | 9.2 (83%) ZnSe: 2.2 |
| #2 | 628 | 37 | 7.7 (21%) ZnSe: 1.4 | 628 | 39 | 8.1 (10%) ZnSe: 1.7 |
| #3 | 625 | 40 | 7.1 (10%) ZnSe: 1.1 | 625 | 40 | 7.2 (4%) ZnSe: 1.2 |
| #4 | 624 | 41 | 6.7 (6%) ZnSe: 0.9 | 622 | 41 | 6.4 (2%) ZnSe: 0.9 |
| #5 | 620 | 45 | 6.1 (3%) ZnSe: 0.6 | 620 | 45 | 5.5 (1%) ZnSe: 0.5 |

TABLE 1B

|  | Prep. Example 2 | | |
|---|---|---|---|
|  | PL(nm) | | arithmetic size, nm (fraction %) ZnSe thickness, nm |
| sample | wavelength | FWHM |  |
| crude | 629 | 40 | 9.19 (100%) ZnSe: 2.38 |
| #1 | 629 | 37 | 9.5 (82%) ZnSe: 2.5 |
| #2 | 627 | 37 | 8.7 (9%) ZnSe: 2.0 |
| #3 | 625 | 39 | 8.0 (5%) ZnSe: 1.7 |
| #4 | 624 | 40 | 7.0 (3%) ZnSe: 1.3 |
| #5 | 620 | 44 | 5.7 (1%) ZnSe: 0.7 |

From the results of Table 1A, the quantum dots of Comparative Preparation Example 1 have an arithmetic size of less than 8 nm, and among the quantum dot populations, a fraction of the first quantum dot population with a size larger than the arithmetic size is relatively low, and a fraction with an arithmetic size of less than 8 nm is relatively high (40% or higher). From the results of Table 1A and Table 1B, the quantum dots of Preparation Example 1 and the quantum dots of Preparation Example 2 have an arithmetic size of greater than 8 nm, and a fraction of first quantum dot population with a size greater than the arithmetic size are 83% and 82%, respectively, In the quantum dots of Preparation Example 2, the first fraction (i.e., the first quantum dot population) have a ZnSe thickness of about 2.5 nm and a ZnS thickness of about 0.37 nm. In the quantum dots of Preparation Example 1, the first fraction (i.e., the first quantum dot population) have a ZnSe thickness of about 2.2 nm and a ZnS thickness of about 0.49 nm.

TABLE 2

|  | Zn: (Se + S) | S: Se | S: In | S + Se: In | Se: In |
|---|---|---|---|---|---|
| Comp. Prep. Example1 | 1.11 | 0.7 | 3.87 | 9.52 | 5.65 |
| Prep. Example 1 | 1.07 | 0.5 | 4.82 | 13.79 | 8.97 |
| Prep. Example 2 | 1.06 | 0.3 | 3.63 | 15.33 | 11.70 |

Production of a Quantum Dot Composite Pattern and Characterization

Example 1

A chloroform dispersion including the plurality of the quantum dots of Preparation Example 1 is prepared and is mixed with a solution of a binder polymer, which is a four membered copolymer of methacrylic acid, benzyl methacrylate, hydroxyethyl methacrylate, and styrene, (acid value: 130 milligrams (mg) of KOH per gram (mg KOH/g), molecular weight: 8,000 g/mol) (solvent:propylene glycol monomethyl ether acetate, PGMEA, a concentration of 30 percent by weight, wt %) to form a quantum dot-binder dispersion.

To the quantum dot-binder dispersion prepared above, a hexaacrylate having the following structure (as a photopolymerizable monomer), ethylene glycol di-3-mercaptopropionate (hereinafter, 2T, as a multi-thiol compound), an oxime ester compound (as an initiator), $TiO_2$ as a metal oxide fine particle (light diffusing agent), and PGMEA (as a solvent) are added to obtain a composition.

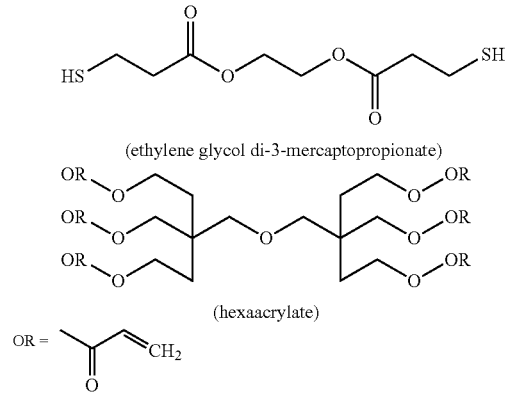

wherein based on a total solid content, the prepared composition includes 42 weight percent (wt %) of quantum dots, 14.5 wt % of the binder polymer, 25 wt % of 2T, 14 wt % of the photopolymerizable monomer, 0.5 wt % of the photoinitiator, and 4 wt % of a light diffusing agent. The total solid content is about 25%.

The composition obtained above is spin-coated on a glass substrate at 150 revolutions per minute (rpm) for 5 seconds (s) to provide a film. The obtained film is pre-baked at 100° C. (PRB). The pre-baked film is exposed to light (wavelength: 365 nanometers (nm), intensity: 100 millijoules (mJ), under a mask having a predetermined pattern (e.g., a square dot or stripe pattern) for 1 second (s) (EXP) and developed with a potassium hydroxide aqueous solution (concentration: 0.043 weight %) for 50 seconds to obtain a pattern of a quantum dot polymer composite (thickness: 6 micrometers (μm)). The obtained pattern is heat-treated at a temperature of 180° C. for 30 minutes under a nitrogen atmosphere (POB).

For the quantum dot composite pattern thus obtained, a photoconversion efficiency (CE) after the POB is measured and the results are listed in Table 3.

Figure 5:
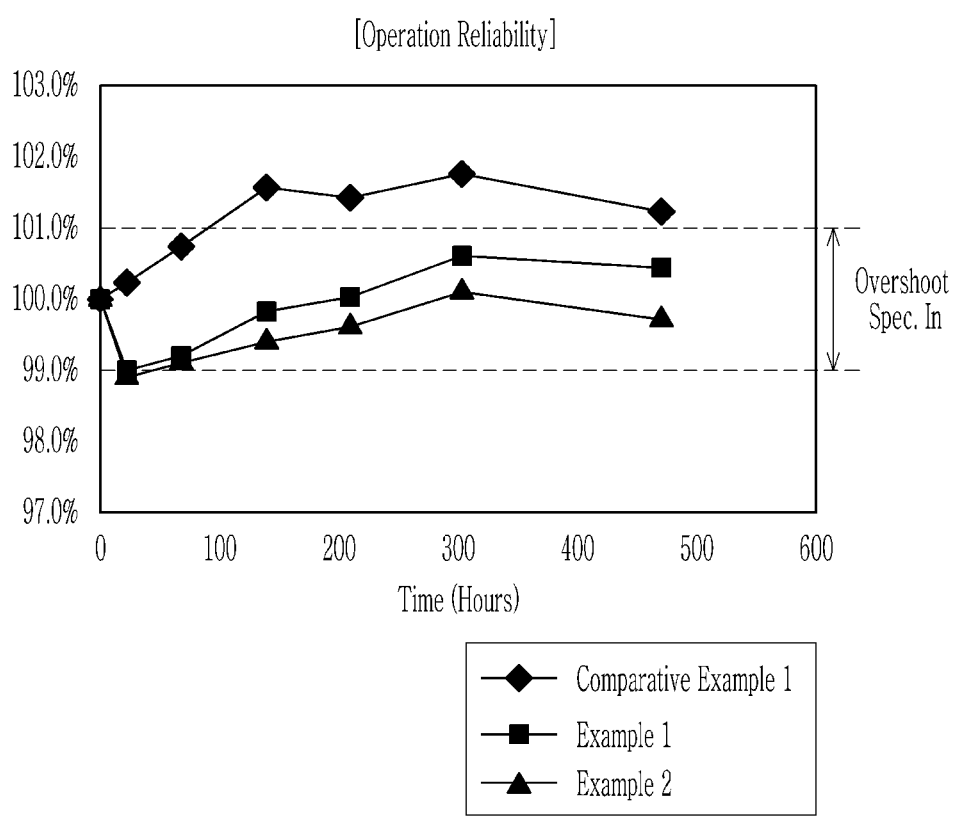
FIG. 5 is a plot showing the operation reliability of a quantum dot composite of Example 1, a quantum dot composite of Example 2, and a quantum dot composite of Comparative Example 1.

For the quantum dot composite pattern thus obtained, an operation reliability is measured and the results are shown in FIG. 5.

Example 2

A quantum dot composite pattern is prepared in the same manner as in Example 1, except for using a chloroform dispersion including the plurality of quantum dots of Preparation Example 2. For the quantum dot composite pattern thus obtained, a photoconversion efficiency (CE) after the POB is measured and the results are shown in Table 3. For the quantum dot composite pattern thus obtained, an operation reliability is measured and the results are shown in FIG. 5.

Comparative Example 1

A quantum dot composite pattern is prepared in the same manner as in Example 1, except for using a chloroform dispersion including the plurality of quantum dots of Comparative Preparation Example 1. For the quantum dot composite pattern thus obtained, a photoconversion efficiency (CE) after the POB is measured and the results are shown in Table 3. For the quantum dot composite pattern thus obtained, an operation reliability is measured and the results are shown in FIG. 5.

TABLE 3

|  | POB CE (%) |
|---|---|
| Example 1 | 38.9 |
| Example 2 | 38.1 |
| Comp. Example 1 | 36.6 |

The results of Table 3 and FIG. 5 confirm that the quantum dot composite pattern of Example 1 and Example 2 exhibit an increased photoconversion efficiency and improved operational reliability in comparison with the quantum dot composite pattern of Comparative Example 1.

From the results of FIG. 5, it is confirmed that a luminance of the quantum dot composite pattern of Example 1 and Example 2 shows a decrease within 100 hours or less and thus the composite has a luminance decrease interval (period).

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A quantum dot composite comprising: a matrix and a plurality of quantum dots dispersed in the matrix,
    wherein the plurality of the quantum dots comprises a semiconductor nanocrystal core including indium and phosphorous, a semiconductor nanocrystal shell disposed on the semiconductor nanocrystal core, the semiconductor nanocrystal shell including zinc, selenium, and sulfur,
    wherein an arithmetic size of the plurality of the quantum dots is greater than or equal to 8.5 nm,
    wherein the quantum dot composite is configured to emit red light,
    wherein as the quantum dot composite is irradiated with light of a wavelength of from about 450 nanometers to about 470 nanometers for a time period of less than or equal to about 500 hours, a luminance increase of the quantum dot composite is less than or equal to about 1.2% of an initial brightness thereof.

2. The quantum dot composite of claim 1, wherein the quantum dot composite exhibits a luminance decrease interval when the quantum dot composite is irradiated with light of a wavelength of from about 450 nanometers to about 470 nanometers is conducted for about 100 hours.

3. The quantum dot composite of claim 1, wherein the quantum dot composite emits red light with a maximum peak wavelength in a range of greater than or equal to about 600 nanometers to less than or equal to about 650 nanometers.

4. The quantum dot composite of claim 1, wherein the arithmetic size of the plurality quantum dots is greater than or equal to about 8.8 nanometers and less than about 15 nanometers.

5. The quantum dot composite of claim 1, wherein the plurality of quantum dots comprise a first quantum dot population with a first arithmetic size, and the first arithmetic size is greater than the arithmetic size of the plurality of quantum dots, and a fraction of the first quantum dot population in the plurality of quantum dots is greater than or equal to about 60 percent.

6. The quantum dot composite of claim 5, wherein the arithmetic size of the plurality of the quantum dots is greater than or equal to about 8.8 nanometers and the first arithmetic size is greater than or equal to about 9.0 nanometers.

7. The quantum dot composite of claim 5, wherein a fraction of the first quantum dot population in the plurality of quantum dots is greater than or equal to about 70 percent.

8. The quantum dot composite of claim 1, wherein the plurality of quantum dots comprise a second quantum dot population with a second arithmetic size, and the second arithmetic size is less than or equal to 7.2 nanometers, and a fraction of the second quantum dot population in the plurality of quantum dots is less than or equal to about 18 percent.

9. The quantum dot composite of claim 1, wherein a size of the semiconductor nanocrystal core is greater than about 3 nanometers.

10. The quantum dot composite of claim 1, wherein the semiconductor nanocrystal shell comprises a first layer including a first semiconductor nanocrystal comprising zinc and selenium, and a second layer disposed on the first layer, the second layer comprising a second semi nanocrystal comprising zinc, sulfur, and optionally selenium, wherein a composition of the first semiconductor nanocrystal is different from a composition of the second semiconductor nanocrystal.

11. The quantum dot composite of claim 10, wherein the first layer has a thickness of greater than or equal to about 1.5 nanometers;
    the second layer has a thickness of less than or equal to about 0.7 nanometers; or
    the first layer has a thickness of greater than or equal to about 1.5 nanometers and the second layer has a thickness of less than or equal to about 0.7 nanometers.

12. The quantum dot composite of claim 1, wherein in the plurality of quantum dots, a mole ratio of zinc to indium (Zn:In) is greater than or equal to about 13:1, and a mole ratio of sulfur to selenium (S:Se) is less than or equal to about 0.6:1.

13. The quantum dot composite of claim 1, wherein in the plurality of quantum dots, a mole ratio of zinc to a sum of sulfur and selenium (Zn:(S+Se)) is less than or equal to about 1.1:1, and a mole ratio of sulfur to selenium (S:Se) is less than or equal to about 0.5:1.

14. The quantum dot composite of claim 1, wherein the plurality of quantum dots comprises a first quantum dot population with a first arithmetic size and a second arithmetic size, and the first arithmetic size is greater than the arithmetic size of the plurality of quantum dots and the second arithmetic size is less than or equal to about 7.2 nm, and in the plurality of quantum dots, a fraction of the first quantum dot population is greater than 60% and a fraction of the second quantum dot population is less than or equal to about 10%.

15. A color filter comprising a quantum dot composite of claim 1.

16. A display device comprising a light emitting element, and a light source, wherein the light emitting element includes the quantum dot composite of claim 1, and the light source is configured to provide the light emitting element with incident light.

17. A composition comprising a plurality of quantum dots, wherein the plurality of quantum dots comprises a first semiconductor nanocrystal comprising indium and phosphorus, and a second semiconductor nanocrystal comprising a zinc chalcogenide, wherein the zinc chalcogenide comprises zinc; and selenium, sulfur, or a combination thereof, wherein an arithmetic size of the plurality of quantum dots is greater than or equal to about 8 nanometers, and the plurality of quantum dots comprises a second quantum dot population having a second arithmetic size, wherein the second arithmetic size is less than or equal to about 7.2 nanometers, and a fraction of the second quantum dots in the plurality of quantum dots is less than or equal to about 18 percent.

18. The composition of claim 17, wherein the fraction of the second quantum dot population is less than or equal to about 15 percent.

19. The composition of claim 17, wherein the plurality of quantum dots comprise a first quantum dot population with a first arithmetic size of greater than or equal to 8 nanometers, and a fraction of the first quantum dots in the plurality of quantum dots is greater than or equal to about 60%.

20. The composition of claim 17, wherein the plurality of quantum dots comprise a first quantum dot population with a first arithmetic size of greater than or equal to 8.5 nanometers, and a fraction of the first quantum dots in the plurality of quantum dots is greater than 80 percent.

21. A quantum dot composite comprising: a matrix and a plurality of quantum dots dispersed in the matrix,
wherein the plurality of the quantum dots comprises a semiconductor nanocrystal core including indium and phosphorous, a semiconductor nanocrystal shell disposed on the semiconductor nanocrystal core, the semiconductor nanocrystal shell including zinc, selenium, and sulfur,
wherein
a mole ratio of zinc to indium (Zn:In) is greater than or equal to about 13:1, and a mole ratio of sulfur to selenium (S:Se) is less than or equal to about 0.6:1, or
a mole ratio of zinc to a sum of sulfur and selenium (Zn:(S+Se)) is less than or equal to about 1.1:1, and a mole ratio of sulfur to selenium (S:Se) is less than or equal to about 0.5:1, or each of the respective mole ratios are satisfied,
wherein an arithmetic size of the plurality of the quantum dots is greater than or equal to 8 nm,
wherein the quantum dot composite is configured to emit red light,
wherein as the quantum dot composite is irradiated with light of a wavelength of from about 450 nanometers to about 470 nanometers for a time period of less than or equal to about 500 hours, a luminance increase of the quantum dot composite is less than or equal to about 1.2% of an initial brightness thereof.

22. The quantum dot composite of claim 21, wherein the plurality of quantum dots comprises a first quantum dot population with a first arithmetic size and a second quantum dot population with a second arithmetic size, and the first arithmetic size is greater than the arithmetic size of the plurality of quantum dots and the second arithmetic size is less than or equal to about 7.2 nm, and in the plurality of quantum dots, a fraction of the first quantum dot population is greater than 60% and a fraction of the second quantum dot population is less than or equal to about 10%.

23. A display device comprising a light emitting element and a light source, wherein the light emitting element includes the quantum dot composite of claim 21, and the light source is configured to provide the light emitting element with incident light.

* * * * *